United States Patent
Iyechika

(10) Patent No.: US 10,619,996 B2
(45) Date of Patent: Apr. 14, 2020

(54) VAPOR PHASE GROWTH RATE MEASURING APPARATUS, VAPOR PHASE GROWTH APPARATUS, AND GROWTH RATE DETECTION METHOD

(71) Applicant: NuFlare Technology, Inc., Kanagawa (JP)

(72) Inventor: Yasushi Iyechika, Matsudo Chiba (JP)

(73) Assignee: NuFlare Technology, Inc., Kanagawa (JP)

( * ) Notice: Subject to any disclaimer, the term of this patent is extended or adjusted under 35 U.S.C. 154(b) by 120 days.

(21) Appl. No.: 15/947,369

(22) Filed: Apr. 6, 2018

(65) Prior Publication Data
US 2018/0224268 A1    Aug. 9, 2018

Related U.S. Application Data

(63) Continuation of application No. PCT/JP2016/079069, filed on Sep. 30, 2016.

(30) Foreign Application Priority Data

Oct. 8, 2015   (JP) .................................. 2015-200332

(51) Int. Cl.
  *G01B 11/06*   (2006.01)
  *H01L 21/02*   (2006.01)
  (Continued)

(52) U.S. Cl.
  CPC ........ *G01B 11/0625* (2013.01); *C23C 16/301* (2013.01); *C23C 16/455* (2013.01);
  (Continued)

(58) Field of Classification Search
  CPC ............ G01B 11/0625; H01L 21/0237; H01L 21/02428; H01L 21/02439;
  (Continued)

(56) References Cited

U.S. PATENT DOCUMENTS 5,724,145 A  *  3/1998  Kondo ............... G01B 11/0625
                                        356/632
2013/0292370 A1*  11/2013  Li ..................... H01L 21/02104
                                        219/448.12
(Continued)

FOREIGN PATENT DOCUMENTS

JP         S62189722 A      8/1987
JP         H074922 A        1/1995
              (Continued)

OTHER PUBLICATIONS

International Preliminary Report on Patentability dated Apr. 10, 2018 for PCT/JP2016/079069, total 7 pages.
(Continued)

*Primary Examiner* — Michael A Lyons
(74) *Attorney, Agent, or Firm* — Rankin, Hill & Clark LLP

(57) ABSTRACT

A vapor phase growth rate measuring apparatus has an initial parameter setting adjuster to set initial values of fitting parameters, a refractive index of each thin film to be formed on the substrate, a growth rate of each thin film, and at least one parameter having temperature dependence, a film thickness calculator to calculate a film thickness of each thin film, a parameter selector to select a value in accordance with a growth temperature for the parameter, a reflectometer to measure a reflectance of the substrate, a reflectance calculator to calculate a reflectance of the substrate, an error calculator to calculate an error between the calculated reflectance and an actual measurement value of the reflectance measured at a plurality of times, a parameter changer to change at least a part of the values of the fitting parameters, and an output value generator to generate characteristic values of each thin film.

20 Claims, 25 Drawing Sheets

(51) Int. Cl.
    *C23C 16/52*     (2006.01)
    *C23C 16/455*     (2006.01)
    *C23C 16/30*     (2006.01)

(52) U.S. Cl.
    CPC ........ *C23C 16/45565* (2013.01); *C23C 16/52* (2013.01); *G01B 11/0616* (2013.01); *H01L 21/0237* (2013.01); *H01L 21/0262* (2013.01); *H01L 21/02428* (2013.01); *H01L 21/02439* (2013.01); *H01L 21/02494* (2013.01)

(58) Field of Classification Search
    CPC ... H01L 21/02494; H01L 22/10; H01L 22/12; H01L 22/20; H01L 22/22
    See application file for complete search history.

(56) References Cited

U.S. PATENT DOCUMENTS

| | | | |
|---|---|---|---|
| 2015/0355103 A1* | 12/2015 | Ando | G01N 21/8851 348/46 |
| 2016/0109299 A1* | 4/2016 | Iyechika | G01J 5/0862 374/126 |
| 2017/0067163 A1* | 3/2017 | Papasouliotis | C23C 14/568 |

FOREIGN PATENT DOCUMENTS

| | | |
|---|---|---|
| JP | H08139147 A | 5/1996 |
| JP | H08264614 A | 10/1996 |
| JP | H09181138 A | 7/1997 |
| JP | 2005121482 A | 5/2005 |
| JP | 2007299894 A | 11/2007 |
| JP | 5050044 B2 | 10/2012 |

OTHER PUBLICATIONS

Breiland, W.G. et al., "A Virtual Interface Method for Extracting Growth Rates and High Temperature Optical Constants from Thin Semiconductor Films Using In Situ Normal Incidence Reflectance," Journal of Applied Physics, 1995, p. 6726-6736, vol. 78, AIP Publishing, USA.

Reentilä, O. et al., "In situ determination of InGaAs and GaAsN composition in multiquantum-well structures," Journal of Applied Physics, 2007, p. 033533, vol. 101, AIP Publishing, USA.

Na, Hyunseok et al., "In-Situ, Real-Time Spectral Reflectance Monitoring of GaN Growth," Journal of the Korean Physical Society, Dec. 2000, p. 971-974, vol. 37 No. 6, Springer Science+Business Media, Germany.

* cited by examiner

| | PARAMETER | REFERENCE | REQUIRED NUMBER | NOTES |
|---|---|---|---|---|
| FIRST METHOD | REFRACTIVE INDEX AND GROWTH RATE OF LAMINATED FILM | n(m), G(m) | THE NUMBER OF KINDS OF LAMINATED FILMS (m) | |
| | REFRACTIVE INDEX AND ABSORPTION COEFFICIENT OF VIRTUAL SUBSTRATE | nusb(h), ksub(h) | THE NUMBER OF GROWTH TEMPERATURE CONDITIONS (h) | |
| SECOND METHOD | REFRACTIVE INDEX AND GROWTH RATE OF LAMINATED FILM | n(m), G(m) | THE NUMBER OF KINDS OF LAMINATED FILMS (m) | |
| | REFRACTIVE INDEX AND ABSORPTION COEFFICIENT OF VIRTUAL SUBSTRATE | nusb, ksub | 1 | ONE UNDER BASIC GROWTH TEMPERATURE CONDITION |
| | COEFFICIENT TO BE MULTIPLIED BY COMPLEX REFRACTIVE INDEX OF VIRTUAL SUBSTRATE | Z(h) | THE NUMBER OF GROWTH TEMPERATURE CONDITIONS − 1 (h − 1) | |
| THIRD METHOD | REFRACTIVE INDEX AND GROWTH RATE OF LAMINATED FILM | n(m), G(m) | THE NUMBER OF KINDS OF LAMINATED FILMS (m) | |
| | REFRACTIVE INDEX AND THICKNESS OF VIRTUAL INTERMEDIATE LAYER | n0(h), G0(h) | THE NUMBER OF GROWTH TEMPERATURE CONDITIONS − 1 (h − 1) | |
| | REFRACTIVE INDEX AND ABSORPTION COEFFICIENT OF VIRTUAL SUBSTRATE | nusb, ksub | 1 | ZERO UNDER BASIC GROWTH TEMPERATURE CONDITION |
| | PHASE SHIFT TO BE APPLIED TO OUTERMOST LAYER | Δ(h) | THE NUMBER OF GROWTH TEMPERATURE CONDITIONS − 1 (h − 1) | |
| FOURTH METHOD | REFRACTIVE INDEX AND GROWTH RATE OF LAMINATED FILM | n0(h), G0(h) | THE NUMBER OF KINDS OF LAMINATED FILMS (m) | |
| | REFRACTIVE INDEX AND ABSORPTION COEFFICIENT OF VIRTUAL SUBSTRATE | nusb, ksub | 1 | d0 IS ZERO UNDER BASIC GROWTH TEMPERATURE CONDITION d0 MAY BE NEGATIVE VALUE ACCORDING TO TEMPERATURE |

FIG.12

VAPOR PHASE GROWTH RATE MEASURING APPARATUS, VAPOR PHASE GROWTH APPARATUS, AND GROWTH RATE DETECTION METHOD

CROSS REFERENCE TO RELATED APPLICATIONS

This application is based upon and claims the benefit of priority from the prior Japanese Patent Application No. 2015-200332, filed on Oct. 8, 2015, the entire contents of which are incorporated herein by reference.

FIELD

Embodiments according to the present invention relate to a vapor phase growth rate measuring apparatus, a vapor phase growth apparatus, and a growth rate detection method.

BACKGROUND

When a thin film is formed on a substrate, it is useful for controlling a film formation process to measure an optical constant of the formed thin film and a speed of film formation in-situ. That is, during the film formation and at that place, whether a thin film of a target material is formed can be determined based on the optical constant of the formed thin film, and whether a thin film having a target film thickness is formed can be determined based on the speed at which the thin film is formed. Here, the speed of the thin film formation is obtained by dividing the thickness of the formed thin film by a forming time of the thin film. The speed is expressed by using units in which the thickness is divided by time such as nanometer/minute and micron/hour. The speed at which the thin film is formed is referred to as a growth rate below.

As a method of uniformly forming the thin film over a wide area with good reproducibility, a method of forming a film in vapor phase (vapor phase growth method) such as metal organic chemical vapor deposition (MOCVD), molecular beam epitaxy (MBE), and sputtering methods have been well known. These methods are important as industrial thin film forming methods. As an in-situ observing method of the optical constant and the growth rate of the thin film formed by these vapor phase growth methods, a method of monitoring a temporal change of a reflectance of light beam is known. In this method, an object on which the thin film is formed is irradiated with light beam through an optical window provided in a wall surface of a thin film forming device, and a reflectance of light beam having a specific wavelength is measured during a film formation process. In a case where a surface of the substrate on which the thin film is formed is a mirror surface, an observed reflectance of the light beam emitted to the thin film periodically changes relative to the film thickness of the thin film by an interference effect between reflected light beam on the surface of the formed thin film and reflected light beam on an interface between the substrate and the thin film. The optical constant and the film thickness of the formed thin film can be calculated based on the period of the change of the reflectance relative to the film thickness, the minimum value and the maximum value of the reflectance, and the like, and the growth rate can be calculated based on a film forming time of the thin film (refer to JP 5050044 B).

A method of calculating the optical constant and the growth rate of the formed film based on film thickness dependency of the reflectance will be described below.

In a case where light beam vertically enters the substrate, when it is assumed that a reflectance of an electric field at the interface between air (refractive index=1) and the thin film (refractive index=n, absorption coefficient=0) formed on the substrate be $r_0$, the value $r_0$ is expressed by the following formula (1). Hereinafter, in the present embodiment, "air" may be read as "vacuum" or "gas".

$$r_0 = (1-n)/(1+n) \quad (1)$$

A reflectance $r_1$ at the interface between the thin film and the substrate is expressed by the following formula (2) by using an absorption coefficient $k_s$ of the substrate and a refractive index $n_s$ of the substrate.

$$r_1 = (n - ik_s - n_s)/(n + ik_s + n_s) \quad (2)$$

In the formula (2), the reference i is an imaginary unit.

Reflected light beam from the actual thin film includes all of the reflected light beam of the interface between air and the thin film and light beam which passes through the interface between air and the thin film, reciprocating between the interface of the thin film on the side of the substrate and the interface on the side of air for p times (p is an integer of equal to or more than one), and then, passing through the interface between the thin film and air and returning to the air side. Furthermore, since the phase changes when the light beam passes through the thin film, in consideration of the change of the phase, an electric field $E_r$ of the reflected light beam is expressed by the following formula (3).

$$\begin{aligned}E_r &= E_0 r_0 + E_0(1-r_0^2)r_1 \cdot \exp(i2\varphi)\{1 - r_1 r_0 \cdot \exp(i2\varphi) + \\ &\quad (-r_1 r_0)2\exp(i4\varphi) + \ldots\} \\ &= E_0 r_0 + E_0(1-r_0^2)r_1 \cdot \exp(i2\varphi)/\{1 + r_1 r_0 \cdot \exp(i2\varphi)\} \\ &= E_0\{r_0 + r_1 \cdot \exp(i2\varphi)\}/\{1 + r_1 r_0 \cdot \exp(i2\varphi)\}\end{aligned} \quad (3)$$

The reference $E_0$ in the formula (3) is an electric field of the light beam emitted to the thin film. Therefore, an electric field reflectance r of the thin film is expressed by the following formula (4).

$$r = E_r/E_0 = \{r_0 + r_1 \cdot \exp(i2\varphi)\}/\{1 + r_1 r_0 \cdot \exp(i2\varphi)\} \quad (4)$$

Here, a phase difference (referred to as phase below) $\varphi$ generated when the light beam reciprocates the inside of the thin film once is expressed by the following formula (5) by using a refractive index n of the thin film, a film thickness d of the thin film, and a wavelength $\lambda$ of the light beam.

$$\varphi = 2\pi n d/\lambda \quad (5)$$

As indicated in the formula (5), the phase $\varphi$ is proportional to the film thickness d and linearly increases as the film thickness d increases. A reflectance (energy reflectance) of the observed light beam is proportional to the square of the amplitude of the reflectance of the electric field. That is, the reflectance of the electric field and the energy reflectance become periodic functions of the film thickness. Conversely, if it is assumed that the film thickness of the thin film is proportional to the growth time, n, $n_s$, $k_s$, and the growth rate (d/time) used in the formula (4) can be obtained from the temporal change of the reflectance through the formulas (1) and (2).

The above example indicates a case where a single film is formed on the substrate. However, the similar method can be used in a case where a thin film is additionally formed after one or more layers of thin films have been formed on the substrate. That is, in a case where two or more thin films are formed on the substrate, the refractive index and the film thickness of a layer on the substrate side of the outermost layer cannot be determined based on only a film thickness dependency of the outermost layer of the reflectance. However, a plurality of layers including the substrate and except for the outermost layer is assumed as a substrate virtually having a refractive index $n_s$, and an absorption coefficient $k_s$, and the refractive index and the growth rate of the outermost layer can be determined based on the film thickness dependency of the outermost layer of the reflectance.

To obtain the optical constant and the growth rate of the thin film to be formed by measuring the above reflectance, it is necessary to have a thickness with which the period of the reflectance relative to the film thickness can be estimated. In a case where the film thickness is very thin, the change of the reflectance relative to the film thickness is only a very small part of the period change. Therefore, the film thickness with which the reflectance is periodically changed cannot be obtained. To accurately estimate the film thickness with which the reflectance is periodically changed, the film thickness with which the reflectance is changed at least about ¼ of one cycle is needed. The film thickness depends on the wavelength of the light beam used to measure the reflectance and the refractive index of the formed film thickness. When it is assumed that the wavelength and the refractive index be respectively 700 nm and 2, the film thickness is estimated to about 50 nm.

On the other hand, as a specific example of the formed thin film having a small thickness, a Multiple Quantum Well (MQW) structure used for an active layer of a blue light beam emitting diode can be exemplified. The MQW structure is a laminated structure of thin films of InGaN layers (quantum well layer, referred to as well layer below) and GaN layers (referred to as barrier layer below). In the structure, a plurality of InGaN layers and GaN layers having a thickness of about several nm is repeatedly laminated. The thickness of the single layer of the InGaN layers and the GaN layers is much thinner than the film thickness of 50 nm which can be estimated by the change of the reflectance. Regarding the single layer of the InGaN layers or the GaN layers, the film thickness and the optical constant cannot be obtained. In addition, a difference between thin film formation temperatures of the InGaN layer and the GaN layer is about several tens of degrees in general. Since the reflectance of the substrate on which the thin film is formed depends on the temperature, it is more difficult to perform analysis based on the reflectance in the structures such as the Multiple Quantum Well structure.

The present invention has been made in view of the above problems. A purpose of the present invention is to provide a vapor phase growth rate measuring apparatus, a vapor phase growth apparatus, and a growth rate detection method capable of easily and accurately detect a growth rate of a thin film on a substrate. Specifically, the inventor found out that some parameters used to calculate the reflectance depend on the temperature, and these parameters are taken as fitting parameters of the change of the reflectance according to the temperature change so that the growth rate and the refractive index can be obtained in the growth of the thin film laminated film such as the MQW layer with the temperature change.

BRIEF DESCRIPTION OF THE DRAWINGS

FIG. 12 is a diagram for collectively describing the parameters used in the first to fourth methods.

DETAILED DESCRIPTION

According to one embodiment, a vapor phase growth rate measuring apparatus has an initial parameter setting adjuster to set initial values of fitting parameters including a complex refractive index of a substrate, a refractive index of each thin film to be formed on the substrate, a growth rate of each thin film, and at least one parameter having temperature dependence, a film thickness calculator to calculate a film thickness of each thin film based on a growth time of each thin film and the set growth rate of each thin film, a parameter selector to select a value in accordance with a growth temperature for the parameter having the temperature dependence, a reflectometer to measure a reflectance of the substrate on which the thin films are formed, a reflectance calculator to calculate a reflectance of the substrate on which the thin films are formed by using the values of the fitting parameters, an error calculator to calculate an error between the reflectance calculated by the reflectance calculator and an actual measurement value of the reflectance measured by the reflectometer of the corresponding thin film at a plurality of times after film formation of each thin film is started, a parameter changer to change at least a part of the values of the fitting parameters in a case where the error is equal to or more than a predetermined value, and an output value generator to generate characteristic values of each thin film based on the values of the fitting parameters at the time when the error is less than the predetermined value.

Figure 1:
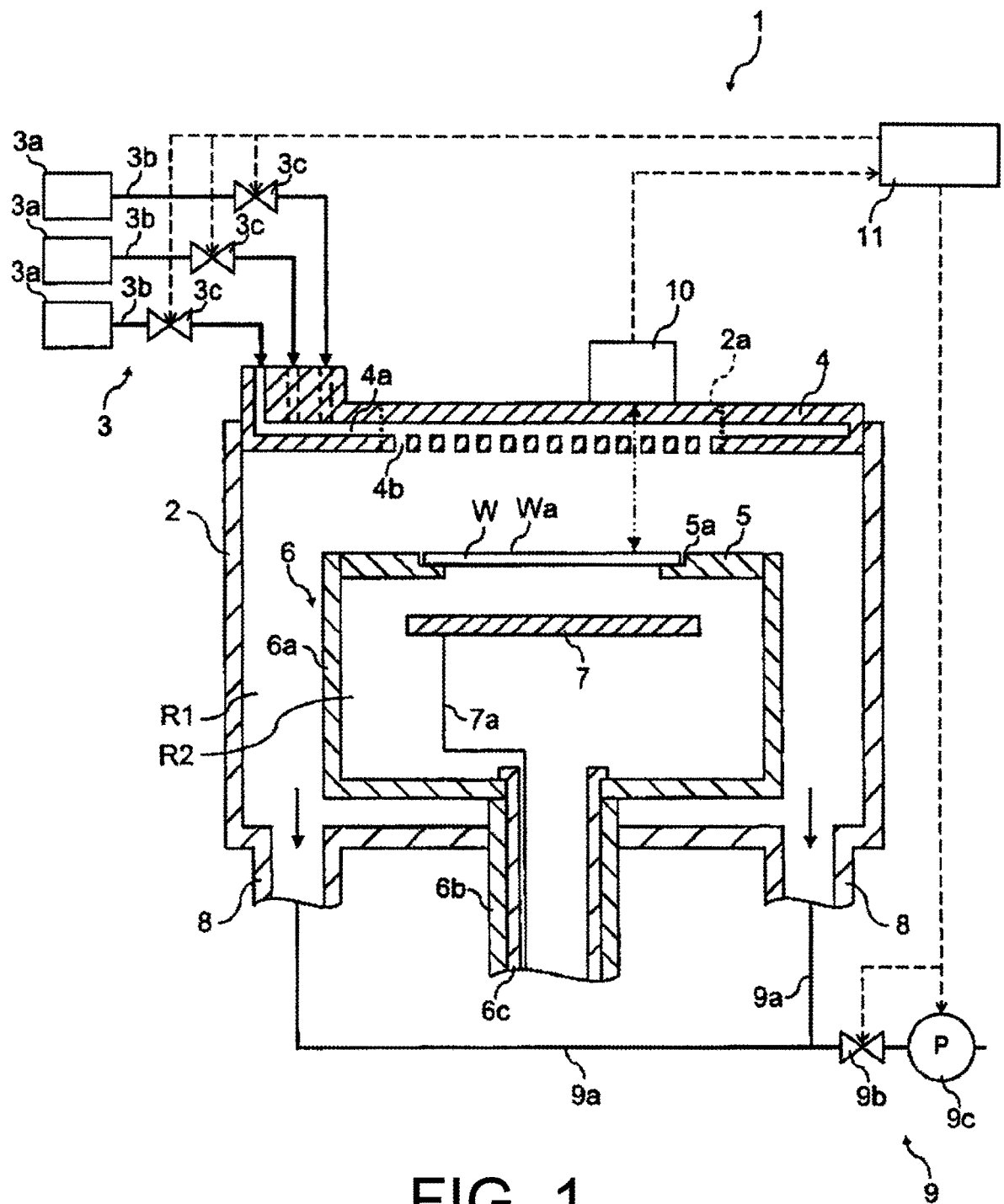
FIG. 1 is a view illustrating a schematic configuration of a vapor phase growth apparatus according to an embodiment.

Embodiments of the present invention will be described below with reference to the drawings. FIG. 1 is a view illustrating a schematic configuration of a vapor phase growth apparatus 1 according to an embodiment. In the present embodiment, an example will be described in which a silicon substrate, more specifically, a silicon wafer (simply referred to as wafer below) W is used as a substrate on which film formation processing is performed and a single film or a plurality of films is/are laminated on the wafer W. In the following description, the MOCVD will be specifically described as an example of a vapor phase growth method.

The vapor phase growth apparatus 1 in FIG. 1 includes a chamber 2 in which the films are formed on the wafer W, a gas supply unit 3 which supplies a source gas to the wafer W in the chamber 2, a raw material discharge unit 4 which is positioned in an upper portion of the chamber 2, a susceptor 5 which supports the wafer W in the chamber 2, a rotation unit 6 which holds and rotates the susceptor 5, a heater 7 which heats the wafer W, a gas discharge unit 8 which discharges gas in the chamber 2, an exhaust mechanism 9 which exhausts the gas from the gas discharge unit 8, a radiation thermometer 10 which measures a temperature of the wafer W, and a controller 11 which controls the units.

The chamber 2 has a shape (for example, a cylindrical shape) capable of storing the wafer W on which the films will be formed, and the susceptor 5, the heater 7, a part of the rotation unit 6, and the like are housed in the chamber 2.

The gas supply unit 3 includes a plurality of gas storage units 3a which individually and respectively stores a plurality of kinds of gases, a plurality of gas pipes 3b which connect the respective gas storage units 3a to the raw material discharge unit 4, and a plurality of gas valves 3c which adjust a flow rate of the gas flowing through the gas pipe 3b. Each gas valve 3c is connected to the corresponding gas pipe 3b. The controller 11 controls the plurality of gas valves 3c. In actual pipe arrangement, a plurality of kinds of configuration can be used, for example, the gas pipes are coupled, a single gas pipe is branched into a plurality of gas pipes, or a branch and coupling of the gas pipes are combined.

The source gas supplied from the gas supply unit 3 passes through the raw material discharge unit 4 and is discharged into the chamber 2. The source gas (process gas) discharged into the chamber 2 is supplied on the wafer W, and accordingly, a desired film is formed on the wafer W. The kind of the source gas to be used is not particularly limited.

A shower plate 4a is provided on the bottom surface side of the raw material discharge unit 4. The shower plate 4a can be made of a metal material such as stainless steel and aluminum alloy. The gases from the plurality of gas pipes 3b are mixed in the raw material discharge unit 4 and supplied into the chamber 2 through gas ejection ports 4b of the shower plate 4a. Alternatively, it is possible that a plurality of gas flow paths is provided in the shower plate 4a and the plurality of kinds of gases are supplied to the wafer W in the chamber 2 while being separated.

The structure of the raw material discharge unit 4 should be selected in consideration of uniformity, a raw material efficiency, reproducibility, a manufacturing cost, and the like of the formed film. However, if these requirements are satisfied, the structure is not particularly limited, and a known structure can be appropriately used.

The susceptor 5 is provided at the upper portion of the rotation unit 6 and has a structure for supporting the wafer W as placing the wafer W on a hole provided on the inner peripheral side of the susceptor 5. In the example in FIG. 1, the susceptor 5 has an annular shape having an opening at the center of the susceptor 5. However, the shape of the susceptor 5 may be a substantially flat plate shape with no opening.

The heater 7 is a heating unit for heating the susceptor 5 and/or the wafer W. If requirements such as an ability to heat an object to be heated to a desired temperature and with a desired temperature distribution, durability, and the like are satisfied, the kind of the heater 7 is not particularly limited. Specifically, resistance heating, lamp heating, induction heating, and the like can be exemplified.

The exhaust mechanism 9 exhausts the reacted source gas from the inside of the chamber 2 via the gas discharge unit 8 and controls a pressure in the chamber 2 to a desired pressure by an action of an exhaust valve 9b and a vacuum pump 9c.

The radiation thermometer 10 is provided on an upper surface of the raw material discharge unit 4. The radiation thermometer 10 irradiates the wafer W with light beam from a light beam source, receives reflected light beam from the wafer W, and measures a reflected light beam intensity of the wafer W. In this way, the radiation thermometer 10 functions as a reflectometer for measuring the reflectance of the film growth surface. In addition, the radiation thermometer 10 receives thermal radiation light beam from a film growth surface Wa of the wafer W and measures a thermal radiation light beam intensity. The radiation thermometer 10 includes a data calculation unit therein. The data calculation unit obtains a temperature of the wafer W from the thermal radiation light beam intensity and the reflectance. For example, the data calculation unit can be configured by a general-purpose computer.

A light beam transmitting window 2a is provided in the upper surface of the raw material discharge unit 4, and the light beam from the light beam source of the radiation thermometer 10 and the reflected light beam and the thermal radiation light beam from the wafer W pass through the light beam transmitting window 2a. The light beam transmitting window 2a may have any shapes such as a slit shape, a rectangular shape, and a circular shape. A transparent member within a wavelength range of light beam to be measured by the radiation thermometer is used to form the window. In a case where a temperature of a room temperature to about 1500° C. is measured, it is preferable to measure a wavelength of light beam in a visible range to light beam in a near-infrared range. In such a case, quartz glass and the like are preferably used as the member of the window.

The controller 11 includes a computer which intensively controls each unit in the vapor phase growth apparatus 1 and a storage unit which stores film formation processing information regarding film formation processing and various programs. The controller 11 controls the gas supply unit 3, a rotating mechanism of the rotation unit 6, the exhaust mechanism 9, and the like based on the film formation processing information and various programs and controls heating of the wafer W by the heater 7.

Figure 2:
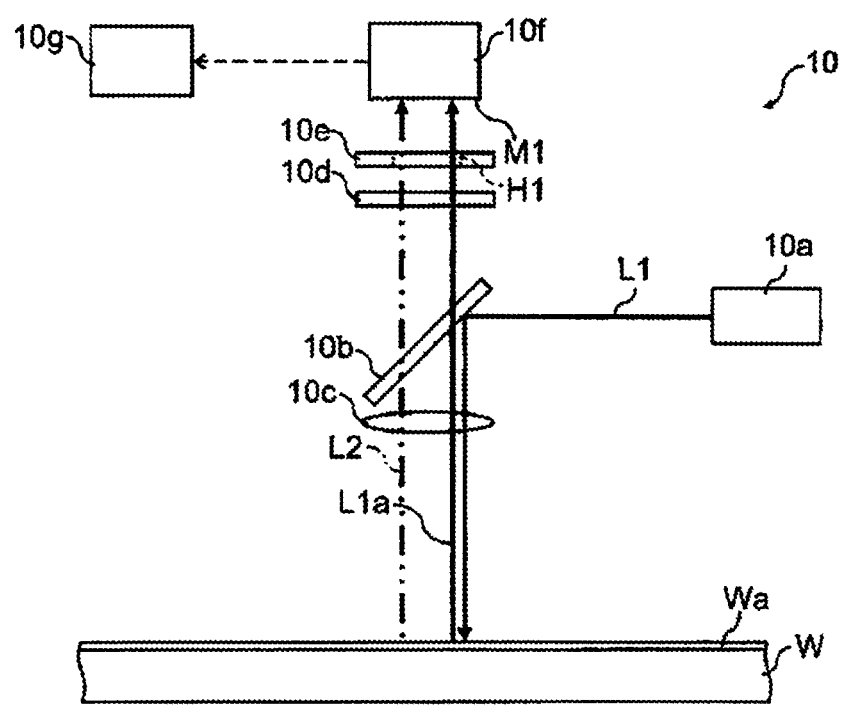
FIG. 2 is a diagram illustrating an internal configuration of a radiation thermometer.

FIG. 2 is a diagram illustrating an internal configuration of the radiation thermometer 10. The radiation thermometer 10 includes a light beam source 10a, a half mirror 10b, a focus adjustment lens 10c, a wavelength selection filter 10d, a diaphragm 10e, a light beam reception unit 10f, and a thermometer controller 10g.

The light beam source 10a emits illumination light beam L1 to be emitted to the wafer W. The half mirror 10b reflects the illumination light beam L1 toward the wafer W while transmitting light beam from the wafer W. The focus adjustment lens 10c forms an image with the illumination light beam L1, transmitted through the half mirror 10b, on the wafer W. Furthermore, the focus adjustment lens 10c forms an image on a light beam reception surface M1 of the light beam reception unit 10f with reflected light beam L1a and thermal radiation light beam L2 from the wafer W. The wavelength selection filter 10d transmits the reflected light beam L1a and the thermal radiation light beam L2 in a predetermined wavelength range of light beam which has transmitted through the half mirror 10b. The diaphragm 10e transmits only light beam from a portion necessary for measurement on the wafer W. The light beam reception unit 10f receives the reflected light beam L1a and the thermal radiation light beam L2 transmitted through the diaphragm 10e. The thermometer controller 10g obtains the temperature of the wafer W based on the intensity of the reflected light beam L1a received by the light beam reception unit 10f (reflected light beam intensity) and the intensity of the thermal radiation light beam L2 (thermal radiation light beam intensity).

In the example of the radiation thermometer described above, an object to be measured is irradiated with light beam in a relatively wide wavelength range, and light beam having a specific wavelength in the reflected light beam is observed by the wavelength selection filter. This is because the thermal radiation light beam intensity needs to be measured within a specific wavelength range. On the other hand, in a case where only the reflectance is needed to be obtained, a method of previously irradiating the object to be measured with light beam having a specific wavelength to measure the reflected light beam intensity can be used. The light beam having the specific wavelength can be obtained by previously passing the light beam in the relatively wide wavelength range through the wavelength selection filter transmitting only the light beam having the specific wavelength. Alternatively, light beam from a monochromatic light beam source such as a laser beam may be used.

The reflectance measured with the radiation thermometer can be used as actual measurement data of the reflectance of the present embodiment. Furthermore, a reflectance measurement apparatus dedicated for the present embodiment may be included in the vapor phase growth apparatus. In addition, as an apparatus for observing a warpage of a substrate, an apparatus which irradiates the substrate with light beam with strong directivity such as laser light beam is used in general. Such a warpage measurement apparatus can measure a reflected light beam intensity while observing the warpage. The reflectance data measured by the warpage measurement apparatus and the like can be used as the actual measurement data of the reflectance of the present embodiment.

The vapor phase growth apparatus 1 according to the present embodiment can be used to form various films on the wafer W. However, in the following description, a case will be described as an example where a buffer layer and a GaN film are formed on the silicon wafer W and an MQW structure is formed on the films.

In the MQW layer, the barrier layers and the well layers are alternately formed. Since the film thickness of each of the barrier layer and the well layer is very thin, it is not easy to accurately detect a growth rate of each thin film.

Figure 3:
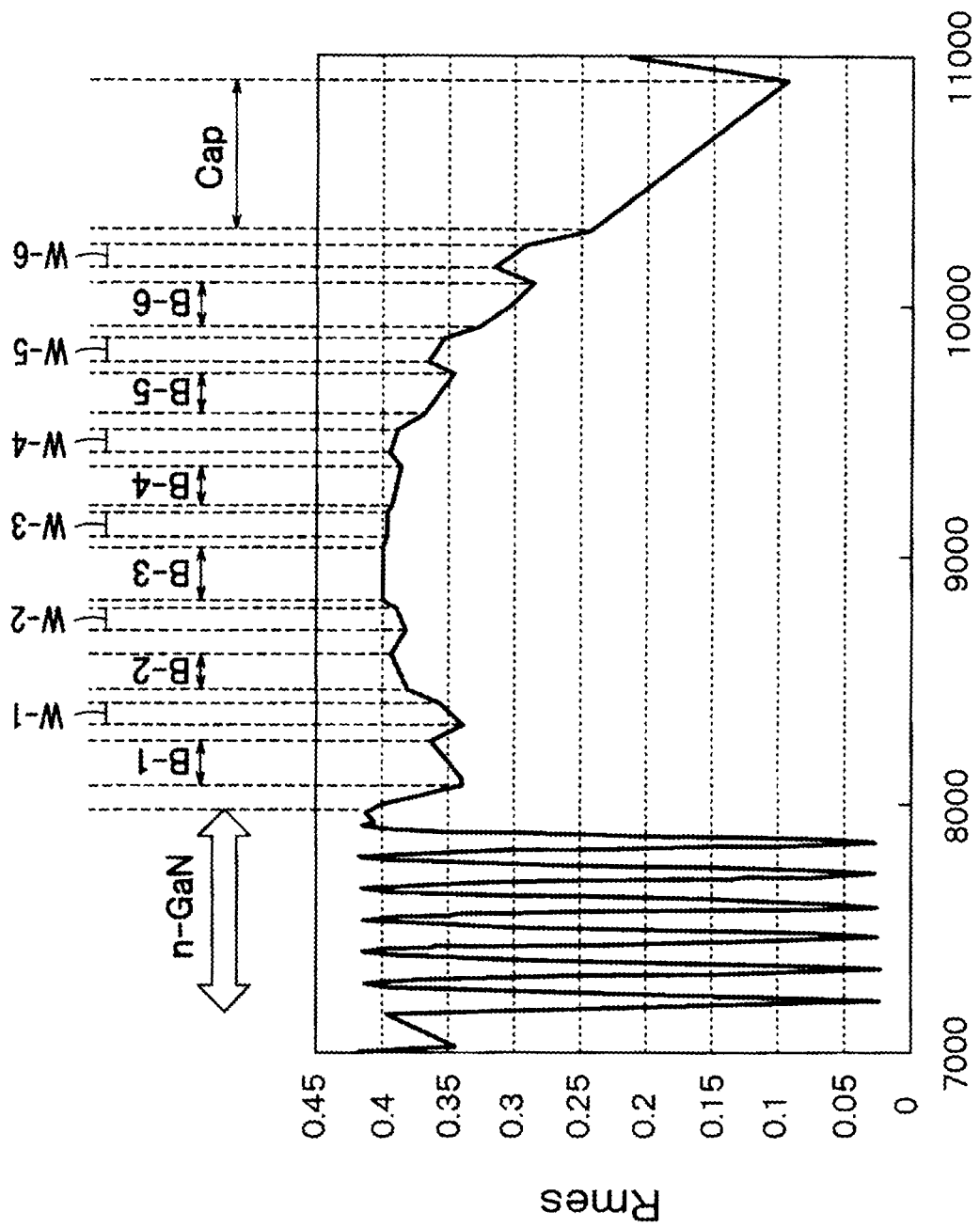
FIG. 3 is a graph illustrating a temporal change of a reflectance Rmes.

FIG. 3 indicates a temporal change of an actually measured reflectance Rmes in a case where an n-type GaN(n-GaN) layer is grown at about 1050° C. after growing the buffer layer on the substrate W, and in addition, the MQW structure in which GaN which is the barrier layer and an InGaN layer which is the well layer are alternately laminated is grown.

In the present embodiment, to measure the reflectance, a reflected light beam intensity Iref of a substance whose reflectance Rref has been already known is measured in advance. For example, in a case of the silicon wafer W, the reflectance is about 30%. When a reflected light beam intensity Imes measured with the radiation thermometer 10 and the like is used, the reflectance Rmes can be obtained by the following formula (7).

$$Rmes = Imes/Iref \cdot Rref \quad (7)$$

In FIG. 3, a growth time of the n-GaN is indicated by a symbol of n-GaN. The number of well layers is six, and in FIG. 3, the respective growth times are indicated by symbols W-1 to W-6 in the order of growth. The number of barrier layers is seven, and in FIG. 3, the respective growth times are indicated by symbols B-1 to B-6 and Cap in the order of growth. The barrier layer is grown at 810° C. and the well layer is grown at 760° C. Since the growth temperature is changed during the growth of each layer, a period in which no layer is grown (growth interruption) is provided. In FIG. 3, periods with no symbols indicate this growth interruption period. The wavelength of the light beam used to measure the reflectance is 660 nm. As can be understood from the graph, the reflectance Rmes is discontinuous each time when the barrier layer and the well layer included in the MQW layer are switched. It is considered that the reason why the reflectance Rmes is discontinuous is that the film formation temperatures of the barrier layer and the well layer are different from each other and refractive indexes, thicknesses, absorption coefficients, and the like of the substrate and a laminated film grown on the substrate change according to the film formation temperature.

A temporal change of the reflectance during the growth of the n-GaN indicates clear periodicity, by fitting a model function expressed by the formula (4) to the temporal change of the reflectance, a growth rate and a refractive index of the n-GaN layer can be obtained. On the other hand, in a case of a single barrier layer or a single well layer, since the thicknesses of these films are thin, the temporal change of the reflectance becomes substantially linear, and almost no periodicity is acknowledged. Therefore, by the fitting indicated by the formula (4) which is premised on a periodic change, the growth rates and the refractive indexes of the single well layer and the single barrier layer cannot be obtained.

In the present embodiment, even in a case where the temporal change of the reflectance is small with only the single layer, fitting is performed with a reflectance change of an entire multilayer structure. Specifically, the temporal change of the reflectance from B-1 to Cap in FIG. 3 corresponds to about ¼ of one period. If the model function of the reflectance can be appropriately expressed, the refractive index and the growth rate of each layer can be obtained by fitting.

Hereinafter, a method of expressing the temporal change of the reflectance in a case where the MQW structure is grown will be specifically described. In general, a reflectance of a multi-layer film in which films with a known thickness and known refractive index are laminated can be calculated by a transfer matrix method and the like. Therefore, the refractive index and the thickness (=growth rate× time) of each layer of the multi-layer film are assumed. In addition, regarding an interface between the MQW layer and a layer on the substrate side of the MQW layer, calculation is performed by using the virtual interface method. That is, the virtual interface method here means that the layer on the substrate side of the MQW layer is assumed as a virtual substrate and a refractive index and an absorption coefficient of the virtual substrate are used as fitting parameters. Actually, since the growth temperatures of the respective layers are different from each other, an influence of the temperature change on the reflectance should be taken. The inventor of the present invention has found that the influence of the temperature change on the reflectance is properly expressed by varying values of some parameters used to calculate the reflectance depending on the growth temperature.

Figure 4:
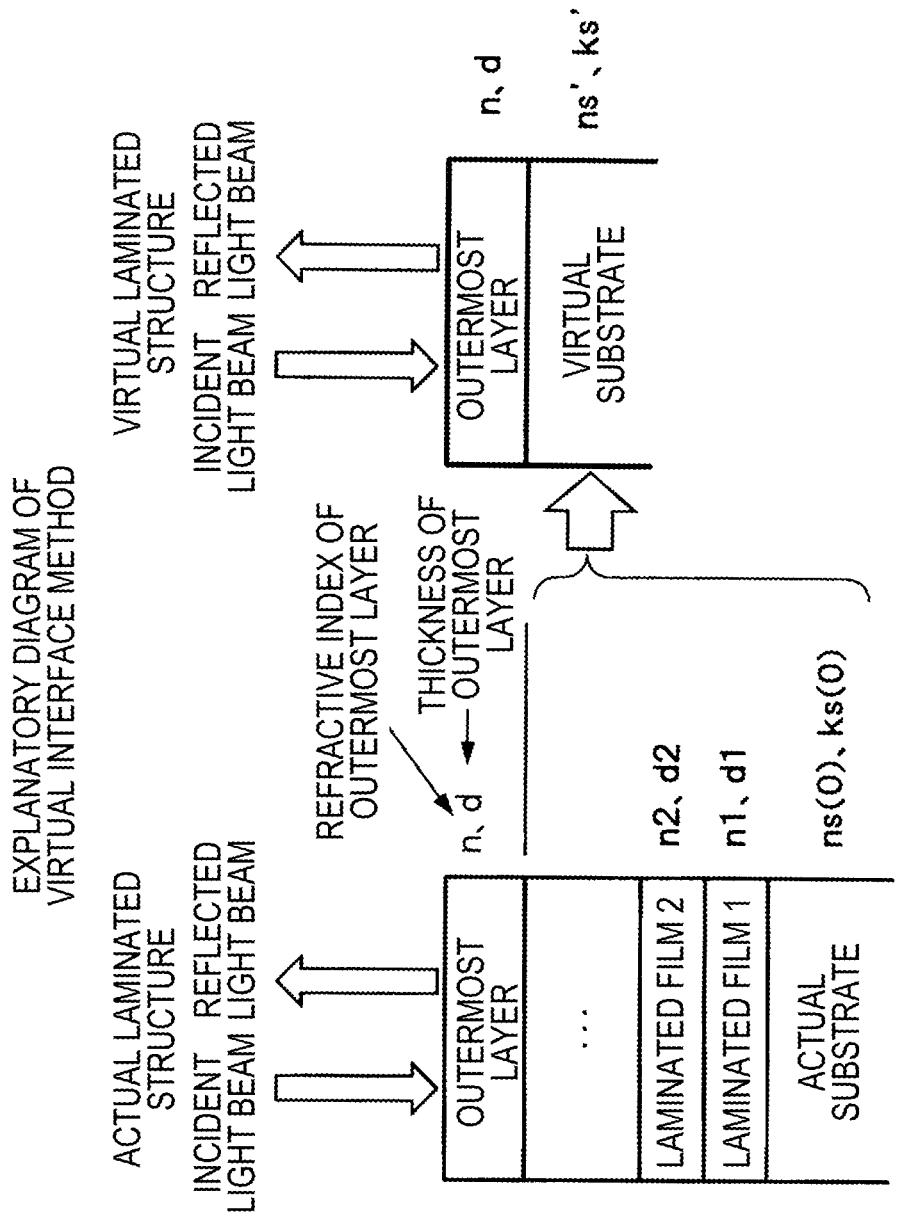
FIG. 4 is a diagram to describe a virtual interface method.

FIG. 4 is a diagram to describe the virtual interface method. In a case where an outermost layer is provided on a plurality of laminated films in which the actual laminated structure is laminated on the substrate, by assuming the substrate and the plurality of laminated films as a virtual substrate and setting an appropriate refractive index, changes in the reflectance of the laminated structure relative to the thickness of the outermost layer become the same with that of the actual laminated structure.

Figure 5:
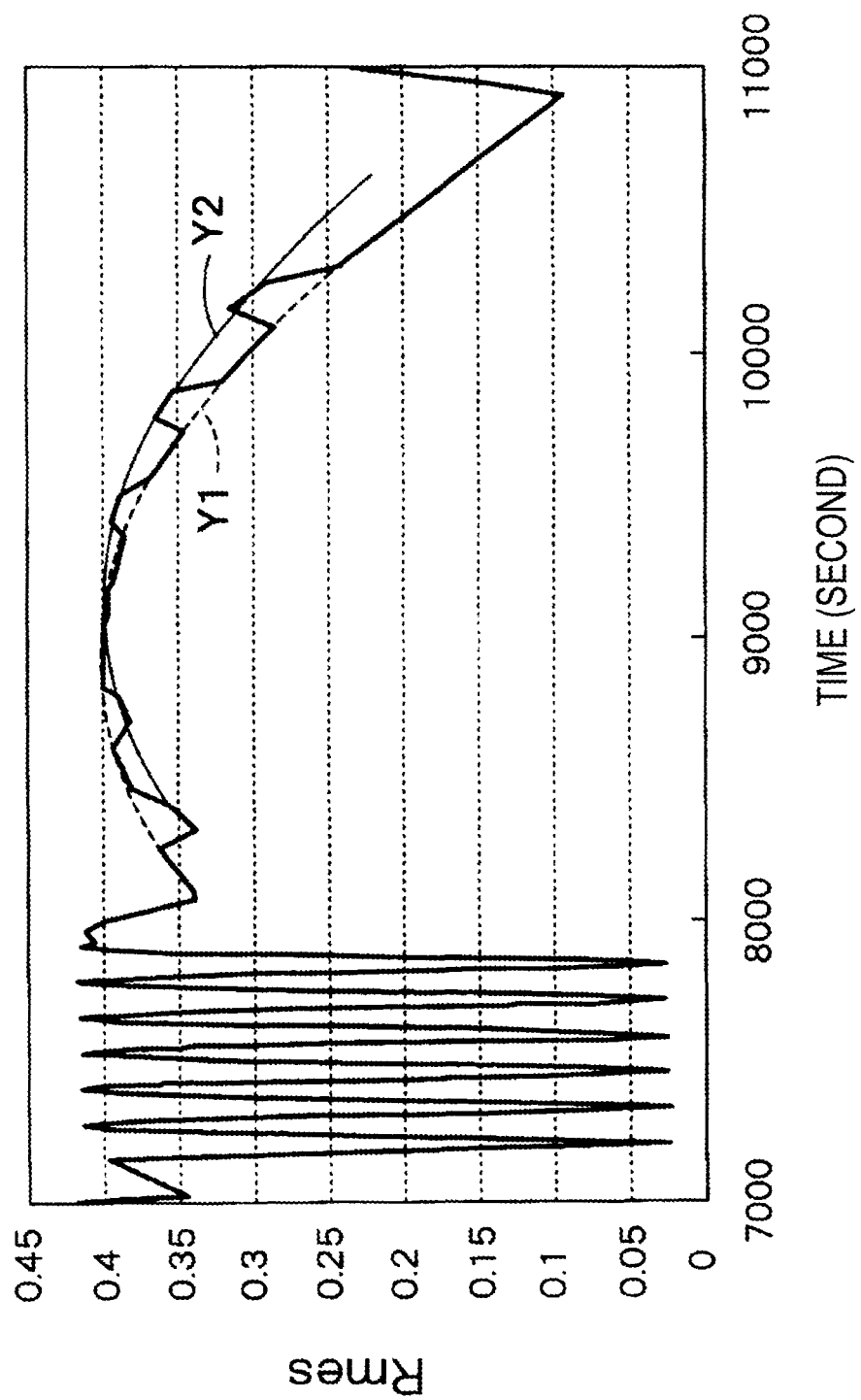
FIG. 5 is a graph illustrating a temporal change of a reflectance Rmes observed when a GaN layer and an MQW layer are grown.

FIG. 5 is a graph illustrating a temporal change of the reflectance Rmes observed when the GaN layer and the MQW layer in the MQW structure are grown. In FIG. 5, curved lines Y1 and Y2 are envelopes of the reflectance during the barrier layer growth and the well layer growth. The temporal change of the reflectance, forming the envelopes, during the growth of each layer is linear, and the refractive index and the growth rate cannot be obtained based on the temporal change. However, if a difference between the two envelopes can be appropriately expressed, the refractive index and the growth rate can be calculated. Actually, the inventor of the present invention has found that the curved line Y2 can be superimposed on the curved line Y1 well by shifting a time axis.

It can be understood that the time gap between the two lines, Y1 and Y2, according to the temperature change is caused by changes of optical constants and the film thicknesses of the substrate and the laminated films according to the temperature change. On the other hand, the optical constant and the film thickness do not change very much according to the temperature. Specifically, the difference between the film thicknesses or the refractive indexes which causes the change illustrated in FIG. 5 is estimated by a model calculation.

Figure 6A:
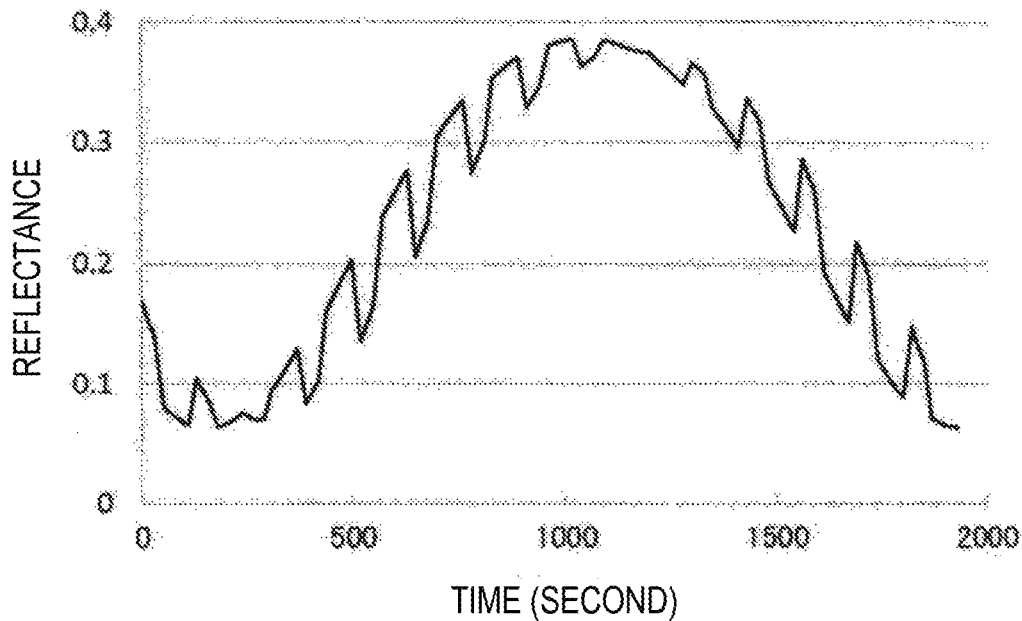
FIG. 6A is a graph illustrating a result of model calculation of a temporal change of a reflectance of a case where it is assumed that a film thickness of a base layer be slightly increased at the time when a barrier layer is grown than that at the time when a well layer is grown, when the MQW layer is grown.
Figure 7:
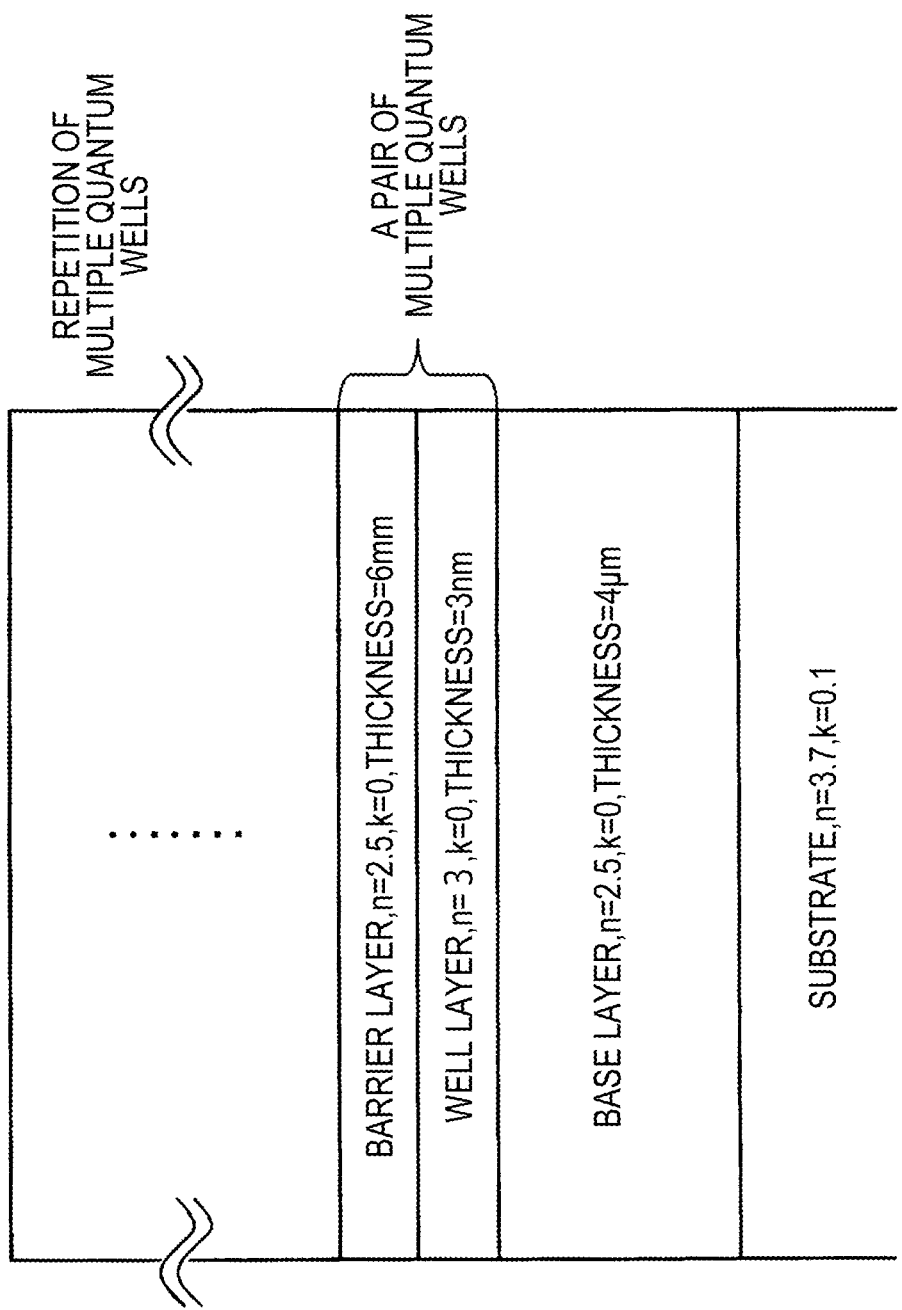
FIG. 7 is a diagram illustrating a model of a laminated structure used for the model calculation illustrated in FIGS. 6a and 6b.

FIG. 6A illustrates the result of the model calculation of the change of the reflectance in a case where the MQW structure is grown. The assumed structure is illustrated in FIG. 7. It is assumed that both the growth rates of the well layer and the barrier layer are 0.1 nm/second. The growth interruption times before and after the growth of the well layer have been set to ten seconds. In the model calculation, it is assumed that the thickness of the base layer change to 4.01 μm only when the barrier layer is grown. This corresponds to an increase in the thickness of the base layer by 0.25% due to thermal expansion.

In FIG. 6A, characteristics according to the temperature change in FIG. 5 are well reproduced. However, in FIG. 6A, the change according to the temperature is emphasized more than it really is. If a model used in FIG. 6A is correct, the thermal expansion of the base layer is presumed to be about 0.1% or equal to or less than 0.1%. A thermal expansion coefficient of an ordinary substance is roughly about $5\times10^{-6}$/° C., and this corresponds to that the temperature change of 100° C. causes expansion of $5\times10^{-4}$. This is about the same as the estimation based on the model calculation, and it can be considered that the model is valid.

Figure 6B:
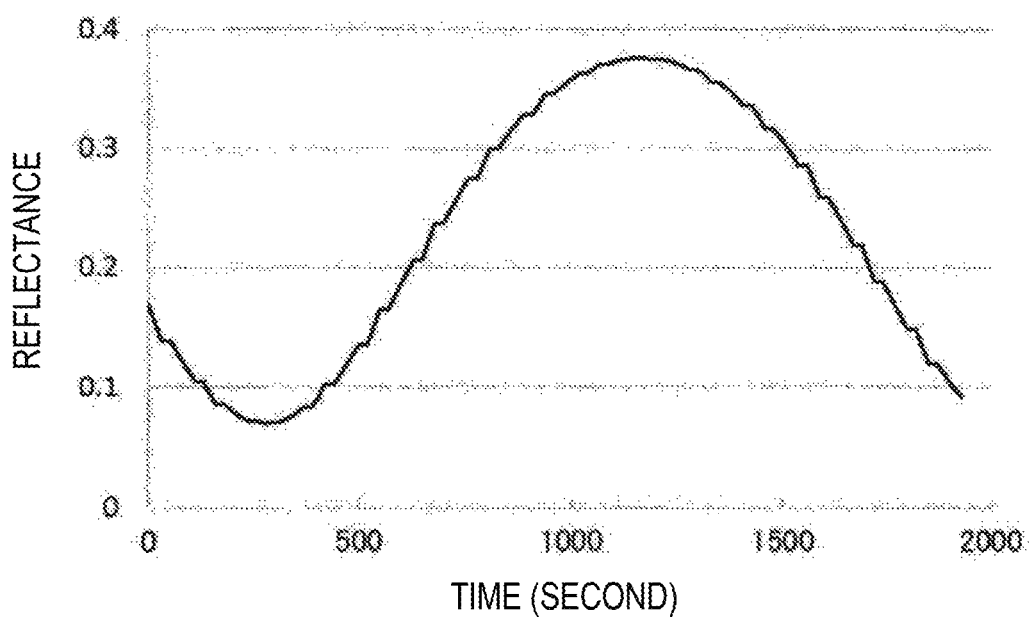
FIG. 6B is a graph illustrating the result of the model calculation of the temporal change of the reflectance of a case where it is assumed that the film thickness of the base layer be not changed between the time when the barrier layer is grown and the time when the well layer is grown, when the MQW layer is grown.

FIG. 6B illustrates the result of the model calculation same as that in FIG. 6A except that the film thickness of the base layer is not changed when the well layer and the barrier layer are grown. No rapid changes in the reflectance according to the temperature change as in FIG. 6A is found. Based on this, it is considered that an optical change of the base layer according to the temperature change causes the rapid changes of the reflectance.

The result similar to that in FIG. 6A can be derived even when it is assumed that the refractive index of the base layer slightly increase depending on the temperature.

Hereinafter, several methods of calculating the temporal change of the reflectance based on the above model will be described. In any case, the key point is how to express the optical change of the base layer according to the temperature change.

In any of the methods described below, the base layer and layers below the base layer are treated as the virtual substrate.

Figure 8:
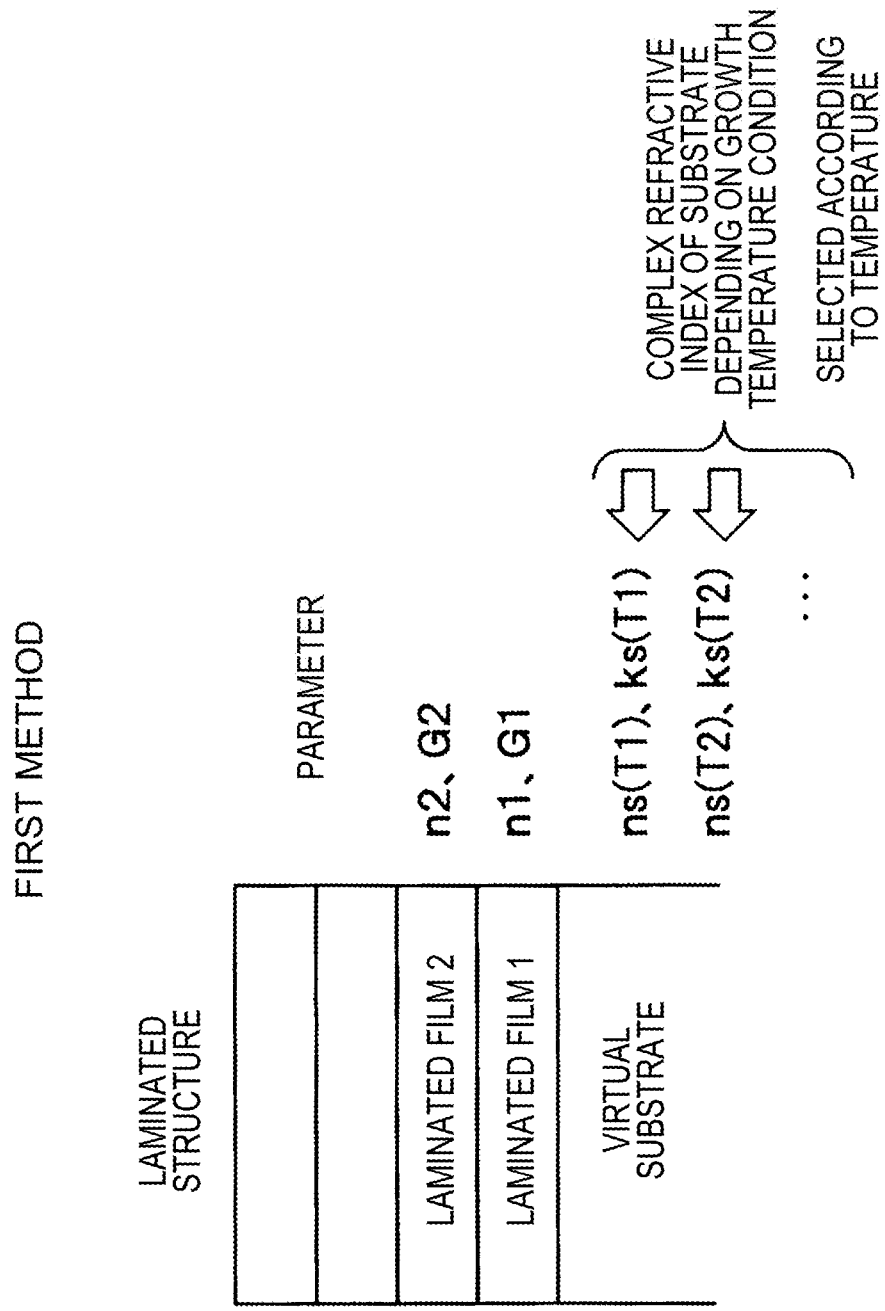
FIG. 8 is a diagram to describe a model structure and parameters used in a first method.

In a first method, as illustrated in FIG. 8, an influence of the temperature change is expressed as a difference in the optical constants of the virtual substrate. Pairs of the optical constants (refractive index ns and absorption coefficient ks) of the virtual substrate as many as the number of growth temperatures are prepared. These optical constants will be fitting parameters when calculated values are fitted to actual measurement values.

Figure 9:
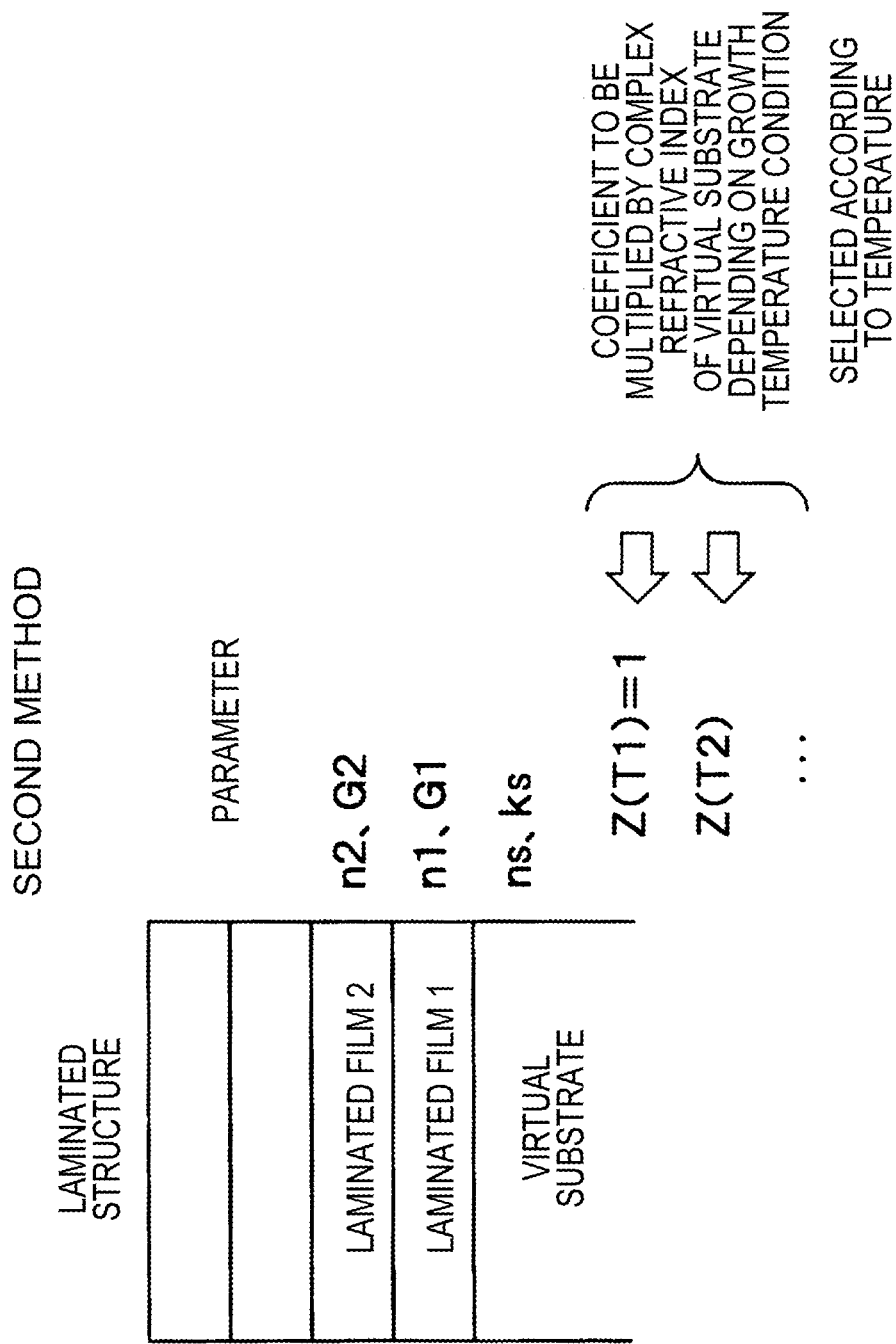
FIG. 9 is a diagram to describe a model structure and parameters used in a second method.

As a second method, it is preferable that a single virtual substrate be prepared and a ratio of the optical constants of the prepared single virtual substrate and the different virtual substrate described above be used as parameters. More specifically, in the second method, as illustrated in FIG. 9, a single optical constant of the virtual substrate at the basic growth temperature is prepared, and the temperature change of the optical constant of the virtual substrate is expressed by multiplying the optical constant of the virtual substrate at the basic temperature by a constant depending on the temperature at the other growth temperatures. The constant depending on the temperature is a complex number in general. Although the specific operations in the respective two methods described above are different from each other, the methods are equivalent in terms of calculation.

Figure 10:
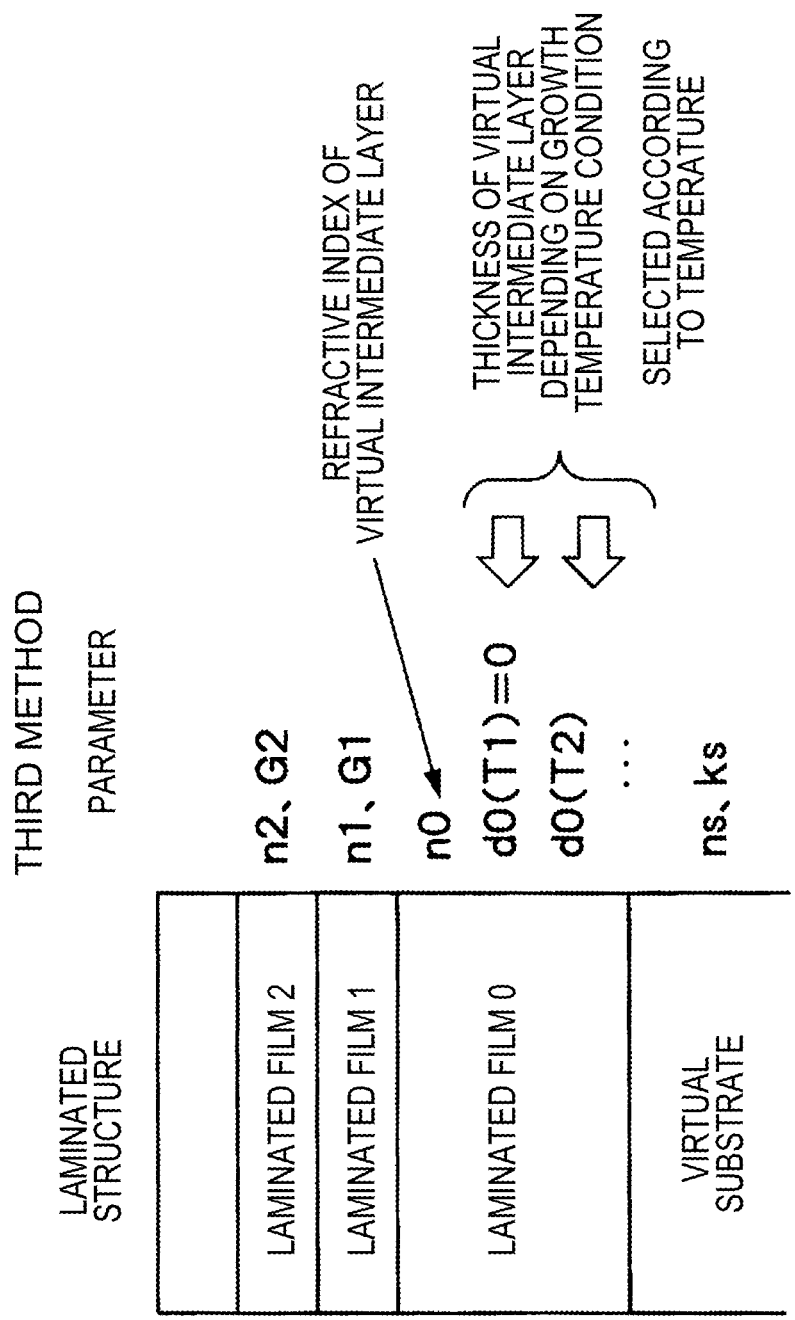
FIG. 10 is a diagram to describe a model structure and parameters used in a third method.

In a third method, as illustrated in FIG. 10, it is assumed that a virtual thin film (intermediate layer) exists on the virtual substrate. When taking FIG. 7 as an example, a thin film having a thickness corresponding to a difference between the thicknesses of the substrate caused by the temperature (existence of thin film of 0.01 µm in FIG. 7) is assumed. In this case, the thickness and the refractive index which change according to the temperature of the virtual thin film are the fitting parameters. The thickness of the virtual thin film is different from that of an actual thin film and may be not only a value equal to or more than zero but also a negative value.

Figure 11:
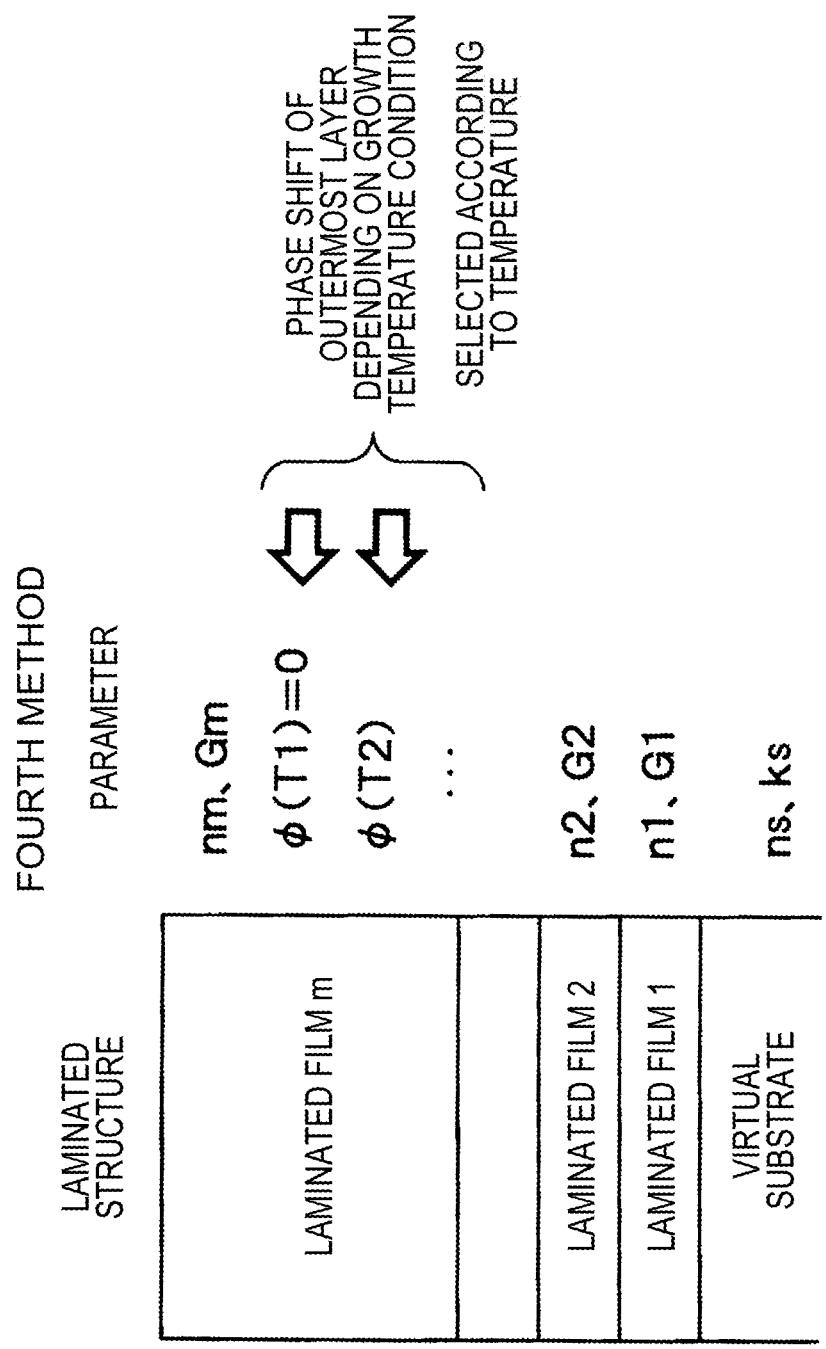
FIG. 11 is a diagram to describe a model structure and parameters used in a fourth method.

In a fourth method, as illustrated in FIG. 11, a shift of a phase of a period of the reflectance caused by the growth temperature in appearance is used. Specifically, by shifting time axis of the curved lines Y1 and Y2 in FIG. 5 from each other, the two temporal changes can be overlapped. Therefore, if a phase depending on the temperature is applied to a phase portion of the reflectance of the outermost layer, the temporal change can be expressed.

Regarding the four methods described above, the kinds and the number of parameters to be used are collectively described in FIG. 12. As illustrated in FIG. 12, in the first method, a refractive index n(m) and a growth rate G(m) of each laminated film, a refractive index nsub(h) and an absorption coefficient ksub(h) of the virtual substrate are used as parameters. The number of refractive indexes n(m) and the growth rates G(m) of each laminated film which have been provided is the same as the number of kinds of the laminated films. Since the refractive index nsub(h) and the absorption coefficient ksub(h) of the virtual substrate depend on a growth temperature condition, the numbers of the provided refractive indexes nsub(h) and absorption coefficients ksub(h) are the same as the number of growth temperature conditions.

In the second method, the refractive index n(m) and the growth rate G(m) of each laminated film, the complex refractive index (nsub and the absorption coefficient ksub) of the virtual substrate, and a coefficient Z(h) to be multiplied by the complex refractive index with no temperature dependence of the virtual substrate are used as parameters. The number of refractive indexes n(m) and the growth rates G(m) of each laminated film which have been provided is the same as the number of kinds of the laminated films. One refractive index nsub and one absorption coefficient ksub of the virtual substrate are provided. The number of provided coefficient Z(h) is the number obtained by subtracting one from the number of growth temperature conditions.

In the third method, the refractive index n(m) and the growth rate G(m) of each laminated film, a refractive index no(h) and a film thickness do(h) of the virtual intermediate layer, the refractive index nsub and the absorption coefficient ksub of the virtual substrate are used as parameters. The number of refractive indexes n(m) and the growth rates G(m) of each laminated film which have been provided is the same as the number of kinds of the laminated films. Each of the number of refractive indexes no(h) and film thicknesses do(h) of the intermediate layer is the number obtained by subtracting one from the number of growth temperature conditions. One refractive index nsub and one absorption coefficient ksub of the virtual substrate are provided.

In the fourth method, a phase shift Δ(h) to be applied to the outermost thin film on the substrate, the refractive index n(m) and the growth rate G(m) of the laminated film, and the refractive index nsub and the absorption coefficient ksub of the virtual substrate are used as parameters. The number of provided phase shifts Δ(h) is the number obtained by subtracting one from the number of growth temperature conditions. The number of refractive indexes n(m) and growth rates G(m) of each laminated film which has been provided is the same as the number of kinds of the laminated films. One refractive index nsub and one absorption coefficient ksub of the virtual substrate are provided.

Figure 13:
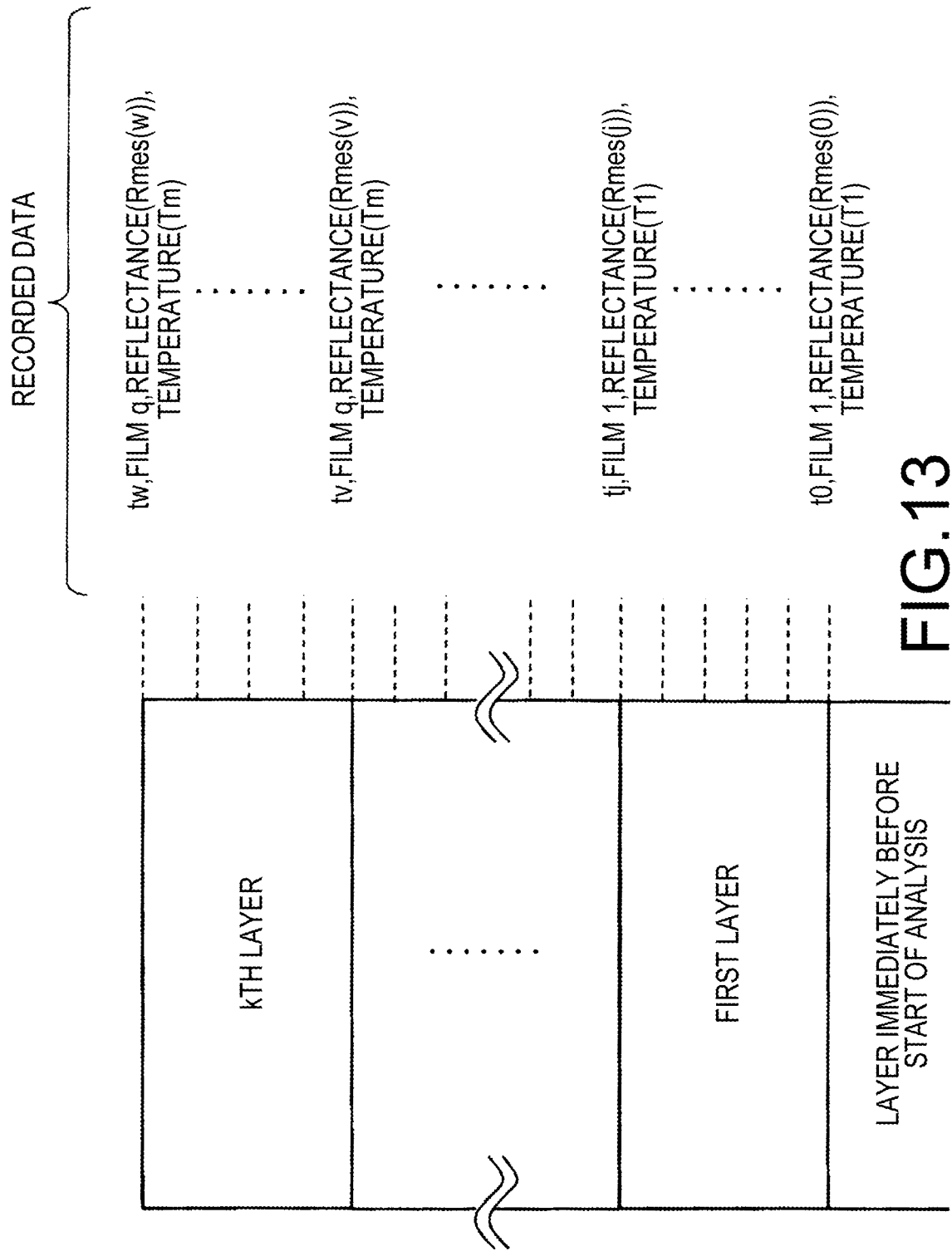
FIG. 13 is a diagram illustrating the laminated structure and data recorded with the temporal change of the reflectance.

First, data acquisition of the temporal change of reflectance will be described with reference to FIG. 13.

A starting time of thin film formation is set to t0. After time t0, process information at time to is periodically recorded from the controller 11 illustrated in FIG. 1. A broken line in FIG. 13 indicates a time when the process information is recorded. The process information includes the time, information whether the film is formed or the growth is interrupted, information on the kind and the temperature of the formed film when the film is formed, and the reflectance. The kind of the film is, for example, a GaN layer or an InGaN layer in a case of the MQW layer which has been described above. The kind of the growth temperature is information of the temperature from among the growth temperatures that are available during the growth. In a case of the MQW layer, there are two kinds of growth temperatures, i.e., a growth temperature of the GaN and a temperature of an InGaN. If it is assumed that the two kinds of growth temperatures be respectively T1 and T2, the kind of the growth temperature is information indicating at which temperature T1 or T2 the film is formed.

It is necessary to set time intervals of the measurement of the reflectance to be short so that the temporal change of the reflectance can be expressed with sufficient accuracy. On the other hand, even if the reflectance is measured at very short time intervals, improvement of analysis accuracy is limited, and there is a case where a calculation time is unnecessarily increased. Suitable time intervals of reflectance measurement are at least five times during the growth of the single layer. Furthermore, in the measurement under such a condition, if measuring points of equal to or more than about 50 points are provided while the reflectance changes for one period, analysis can be sufficiently performed. In a case where the time intervals of the reflectance measurement are short and a large amount of data of the reflectance is measured, although a processing ability of a computer should be considered, the reflectance data may be appropriately reduced so as to satisfy the above conditions.

It is necessary to accurately record the time intervals or the measurement times. However, the time interval of the measurement does not need to be constant, and it is preferable that the measurement be performed at a plurality of times.

Figure 14:
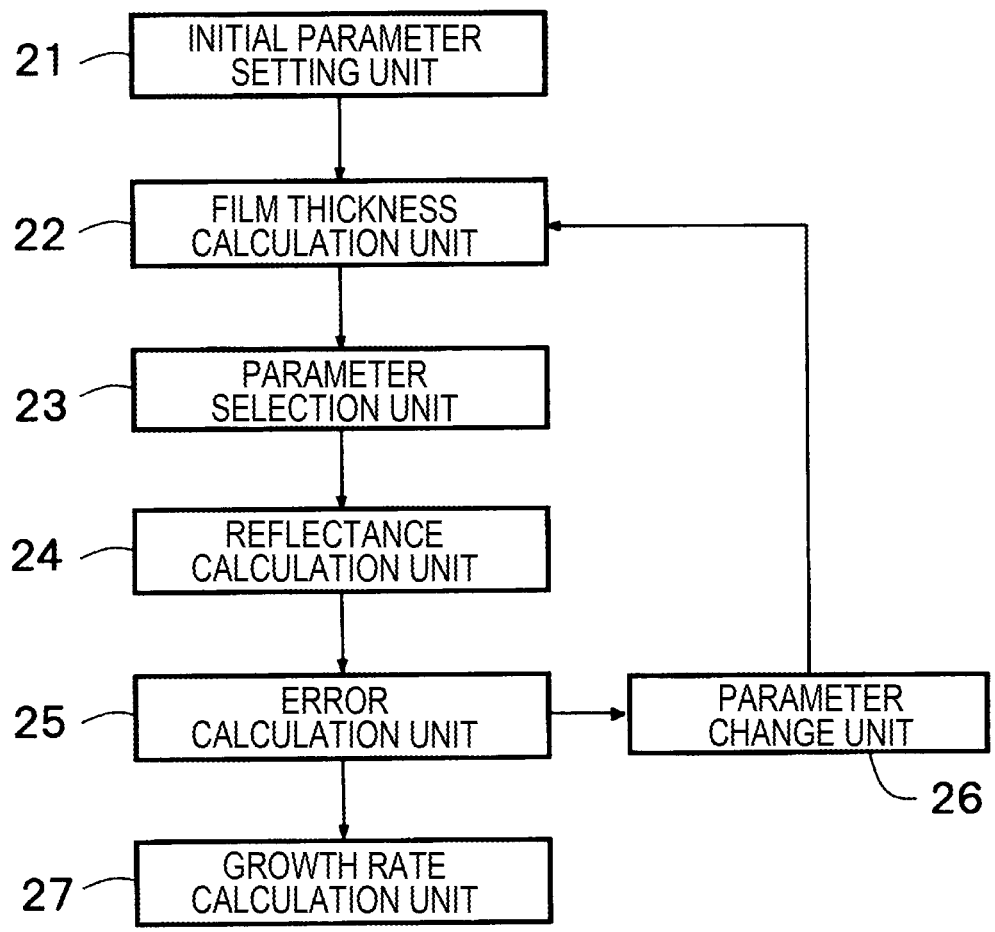
FIG. 14 is a block diagram illustrating a schematic configuration of a vapor phase growth rate measuring apparatus for performing any one of the first to the fourth methods.

FIG. 14 is a block diagram illustrating a schematic configuration of a vapor phase growth rate measuring apparatus 20 for performing any one of the first to the fourth methods described above. Each unit in the block diagram in FIG. 14 may be configured by hardware, software, or a combination of the hardware and the software.

The vapor phase growth rate measuring apparatus 20 in FIG. 14 includes an initial parameter setting unit 21, a film thickness calculation unit (calculator)22, a parameter selection unit (selector)23, a reflectance calculation unit (calculator)24, an error calculation unit (calculator)25, a parameter change unit (changer)26, and a growth rate output unit (output value generator)27. At least a part of the each unit described in the above embodiments may be implemented in either hardware or software. When implemented in software, a program that realizes at least a part of functions of the each unit may be stored on a recording medium such as CD-ROM and read and executed by a computer. The recording medium is not limited to a removable recording medium such as a magnetic disk or optical disk, but may be a non-removable recording medium such as a hard disk device or memory.

The initial parameter setting unit 21 sets initial values of fitting parameters including a complex refractive index of the substrate, the refractive index of each thin film formed on the substrate, the growth rate of each thin film, and a parameter having at least one temperature dependence. The film thickness calculation unit 22 calculates the film thickness of each thin film based on a growth time of each thin film and the growth rate of each thin film set by the initial parameter setting unit 21. The parameter selection unit 23 selects a value corresponding to the growth temperature as the parameter having temperature dependence. The reflectance calculation unit 24 calculates a reflectance of each thin film by using the value of the fitting parameter. The error calculation unit 25 calculates an error between the reflectance calculated by the reflectance calculation unit 24 and the actual measurement value of the reflectance of the corresponding thin film which has been measured by the radiation thermometer 10 for functioning as a reflectometer at a plurality of times after the film formation of the thin films is started. The parameter change unit 26 changes at least a part of the fitting parameters in a case where the error is equal to or more than a predetermined value. The growth rate output unit 27 outputs the growth rate of each thin film based on the parameter when the error is less than the predetermined value.

In the first method, the parameter selection unit 23 selects a complex refractive index of the substrate which changes according to the growth temperature of the outermost thin film on the substrate as one of the parameters. In the second method, the parameter selection unit 23 selects a coefficient which is multiplied by the refractive index having no temperature dependence of the substrate as one of the parameters and changes the coefficient according to the growth temperature of the outermost thin film on the substrate. In the third method, the parameter selection unit 23 selects an intermediate layer, which is disposed between the substrate and the lowermost thin film on the substrate and has the film thickness according to the growth temperature, as one of the parameters. In the fourth method, the parameter selection unit 23 selects a phase offset of the outermost thin film on the substrate as one of the parameters and changes the phase offset according to the growth temperature of the outermost thin film.

A specific calculation procedure of the first method will be described below.

In the example in which the MQW layer is grown, two growth temperatures of the barrier layer and the well layer are provided. Specifically, the two growth temperatures are the growth temperature of the well layer and the growth temperature of the barrier layer. Therefore, in this case, two complex refractive indexes of the virtual substrate are prepared. Generally, in a case where the number of growth temperature conditions is h, h complex refractive indexes of the virtual substrate are prepared.

Figure 15:
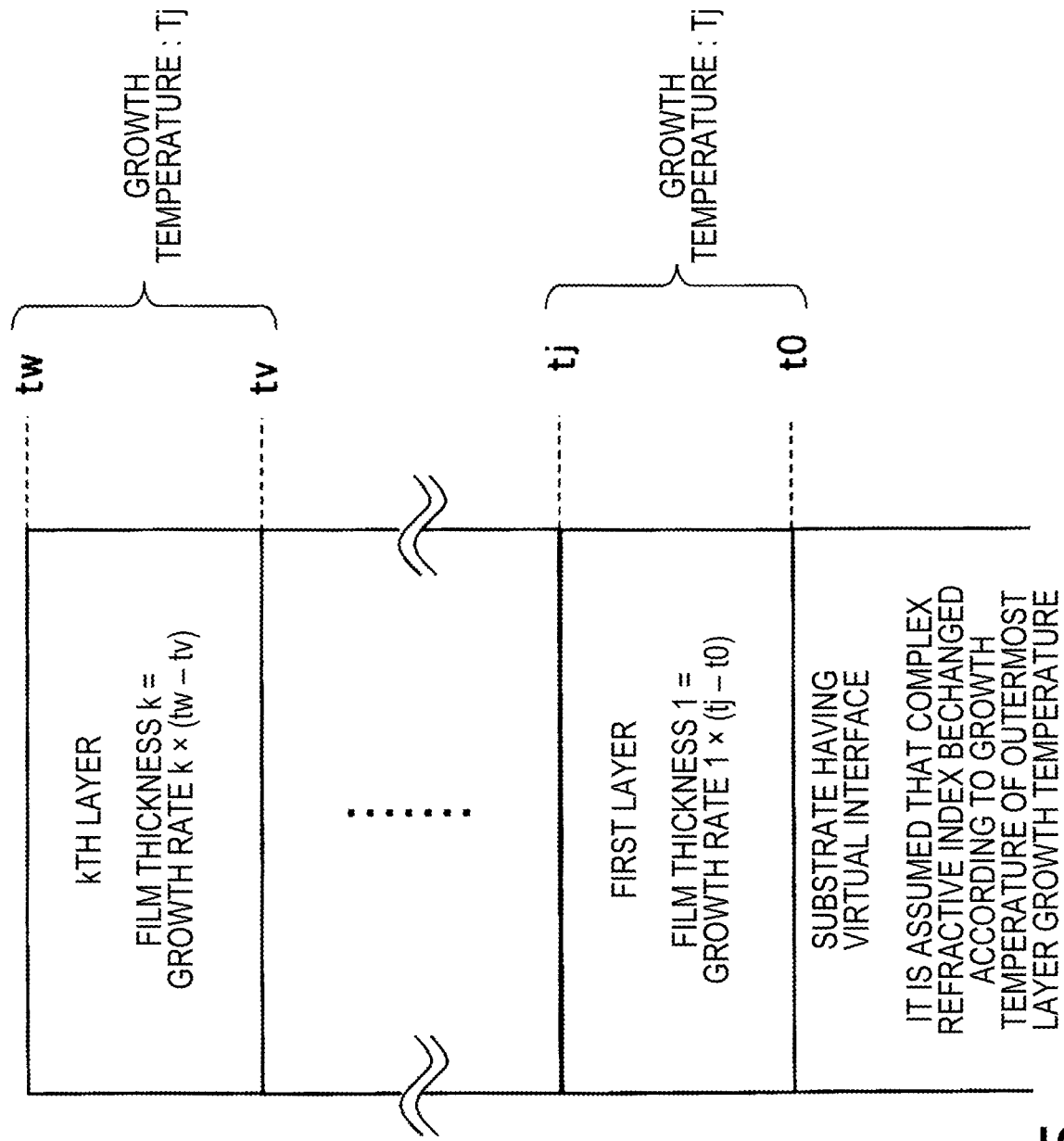
FIG. 15 is a reference diagram for model calculation of a reflectance at time tw.

FIG. 15 is a reference diagram for model calculation of a reflectance at time tw. The complex refractive index of the virtual substrate is determined based on a temperature condition of a kth layer. In the laminated structure on the virtual substrate, the film thickness of each layer is calculated by multiplying the growth rate of each layer by the growth time. The film thickness of the kth layer is increased with time until the growth of the kth layer is completed. Furthermore, by using the refractive index of each layer, it is possible to perform model calculation of the reflectance at the time tw.

Figure 16A:
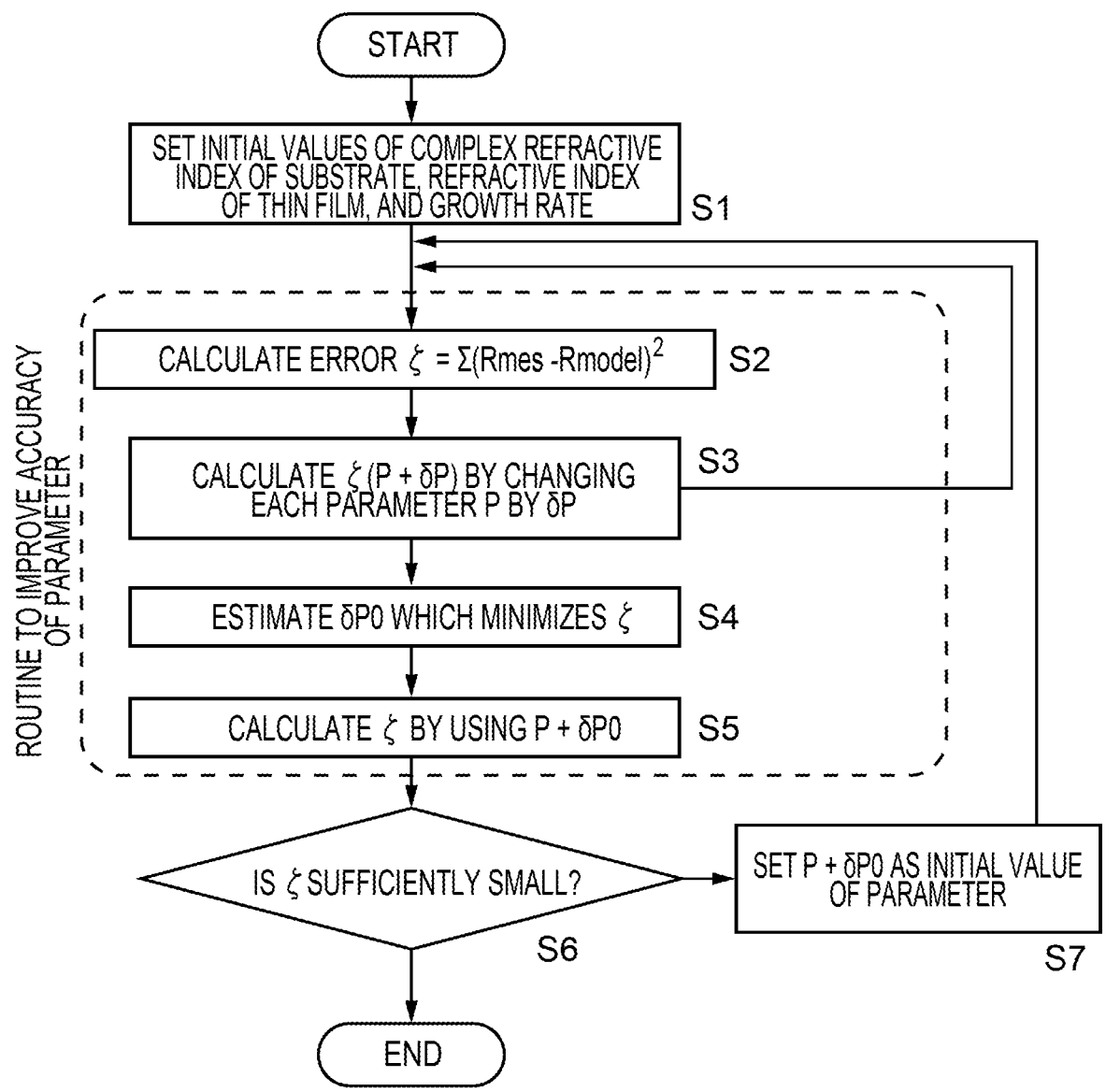
FIG. 16A is a flowchart illustrating a procedure of performing the model calculation of the reflectance based on the first method.
Figure 16B:
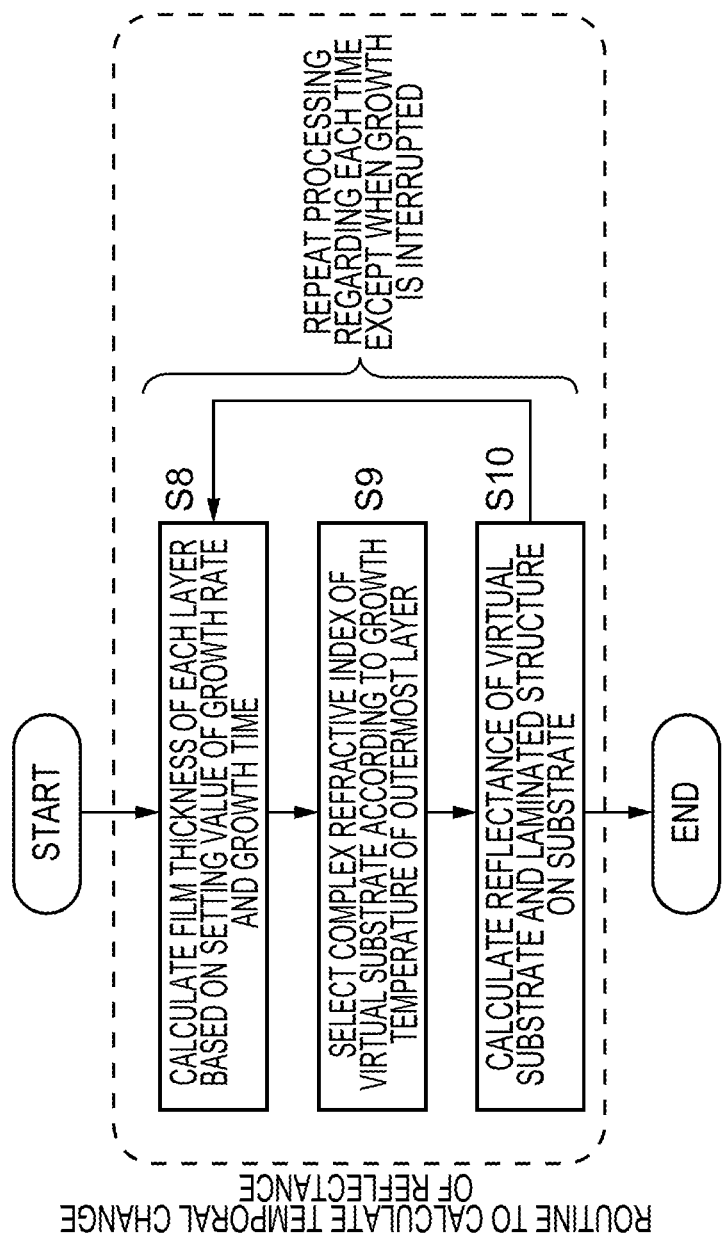
FIG. 16B is a subroutine called out from FIG. 16A.

FIGS. 16A and 16B are flowcharts illustrating a procedure of performing the model calculation of the reflectance based on the first method. First, initial values of various parameters used for the model calculation of the reflectance are set (step S1, initial parameter setting unit 21). Next, an error between the temporal change of the observed reflectance and the temporal change of the model-calculated reflectance is calculated (step S2, error calculation unit 25). The error ($\zeta$) is calculated as a sum of square of a difference between an actually measured reflectance (Rmes) and a model-calculated reflectance (Rmodel) at each observation time of the reflectance. Since the error $\zeta$ is a function of each parameter (P) used for calculation, the error is described as $\zeta(P)$.

Next, a part or all of the parameters are slightly ($\delta P$) changed from the current value (P). For example, in a case where an initial value of ns is 2.00, the value of ns is set to be 2.01 and the like. This change amount is expressed as $\delta ns$. Here, the parameters are, for example, ns, ks, the refractive index, the growth rate, and the like of each layer of the thin film. The parameter is referred to as a fitting parameter. When performing the processing of the step S2, a subroutine in FIG. 16B is called out. In the subroutine, the film thickness of each of the laminated layers used for calculation is obtained by multiplying the growth rate by the growth time (step S8, film thickness calculation unit 22). Here, the growth rate of each layer is the fitting parameter and is optimized together with the refractive index of each layer and the complex refractive index of the virtual substrate according to an optimization procedure to be described later.

Next, according to the growth temperature condition, the complex refractive index of the virtual substrate is selected (step S9). Next, the model calculation of the reflectance is performed by using the complex refractive index of the virtual substrate and the film thickness and the refractive index of each of the laminated films (step S10).

The processings in steps S8 to S10 are repeatedly performed at all observation times except for during the growth interruption. Next, the error $\zeta(P+\delta P)$ is calculated (step S3). Even when performing the processing in the step S3, the subroutine in FIG. 16B is called out to repeat the processings of steps S8 to S10.

As necessary, $\zeta(P+\delta Pq)$ may be calculated by using several different $\delta Pq$. In this step, dependency of $\delta P$ on $\zeta$ is approximately obtained. Here, different refractive indexes are prepared for the respective layers having different growth rates. This is because, there is a case where the refractive indexes of the formed thin films are different even under the same film formation conditions except for the growth rate. However, in a case where it is previously known that the refractive indexes are the same even when the growth rates are different, the same refractive indexes may be used for these layers. Furthermore, the refractive indexes of the substrate and the thin film are complex numbers in general. However, in a case of a transparent material, the refractive index is a real number. Hereinafter, it is assumed that the refractive index of the virtual substrate be the complex number and the refractive index of the film to be formed be the real number. However, in a case where the refractive index of the thin film to be formed is the complex number, a parameter (an imaginary part of complex refractive index=absorption coefficient) is added, and the procedure is basically the same. Specifically, it is preferable that a refractive index (n) of a real number appearing in each calculation formula be replaced with a refractive index (n+ik) of a complex number by using the absorption coefficient k.

Next, δP (δPo) which minimizes ζ is estimated based on the dependency of δP on ζ obtained in step S3 (step S4). Next, ζ(P+δPo) is calculated by using P+δPo obtained from step S4(step S5). Even when performing the processing of step S5, the subroutine in FIG. 16B is called out to repeat the processings of steps S8 to S10.

Next, it is judged whether ζ(P+δPo) is sufficiently small (step S6). If this value is smaller than a predetermined set value, it is considered that the value of each parameter used for the calculation is close to a true value. On the other hand, in a case where this value is not smaller than the predetermined set value, it is considered that the parameter used for the calculation has a large error. In this case, the processing returns to S2 again, and the calculation is repeated by using P+δPo as a new initial value (step S7). In general, according to such a procedure, the error ζ gradually decreases, and the parameters can be eventually determined.

When the above calculation is performed while the thin film is actually formed, a next reflectance may be observed before the error ζ sufficiently decreases. In this case, optimization may be proceeded by adding new observation data by using an optimal solution of the parameter at that time.

Figure 17A:
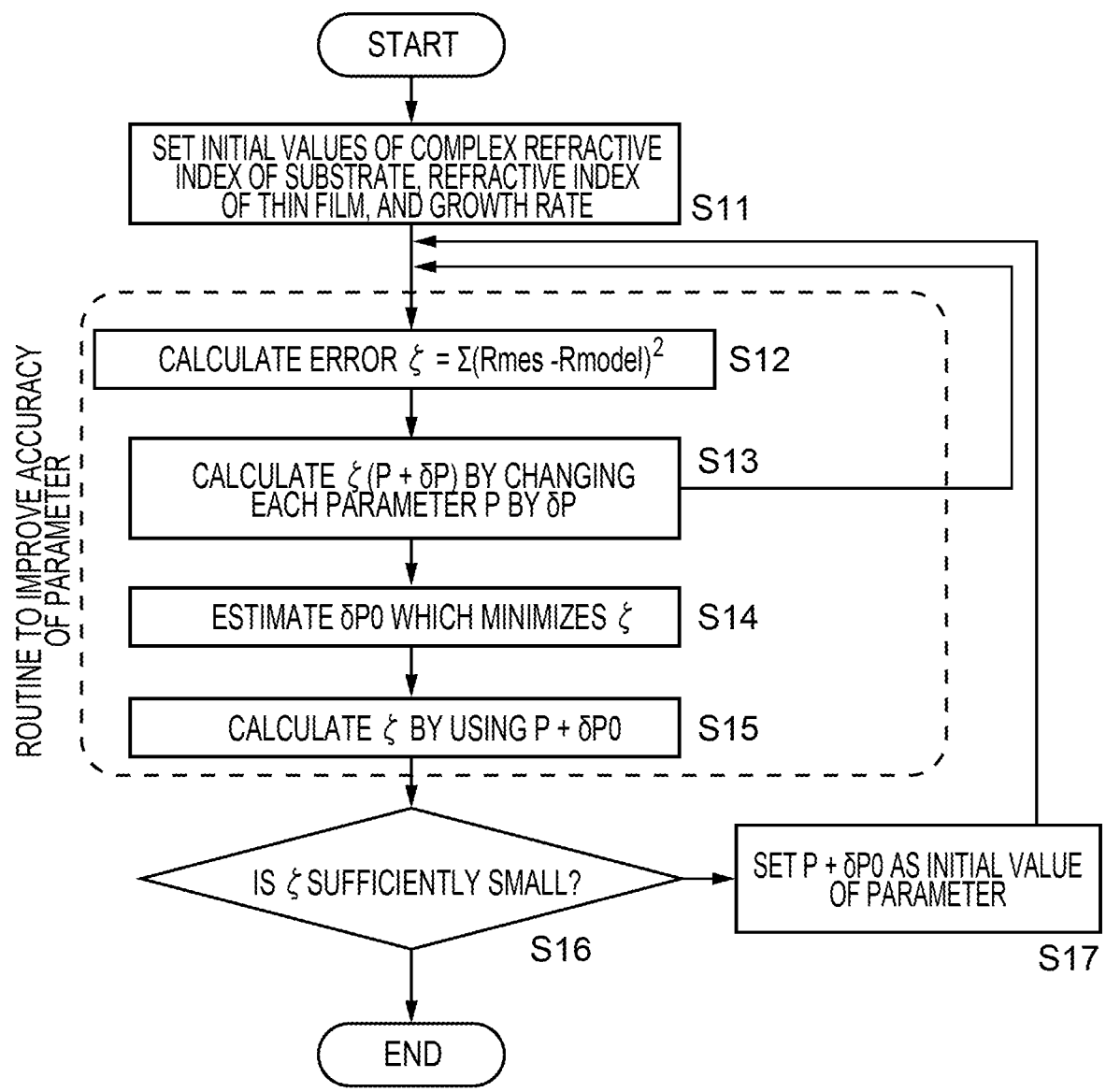
FIG. 17A is a flowchart illustrating a procedure of performing the model calculation of the reflectance based on the second method.
Figure 17B:
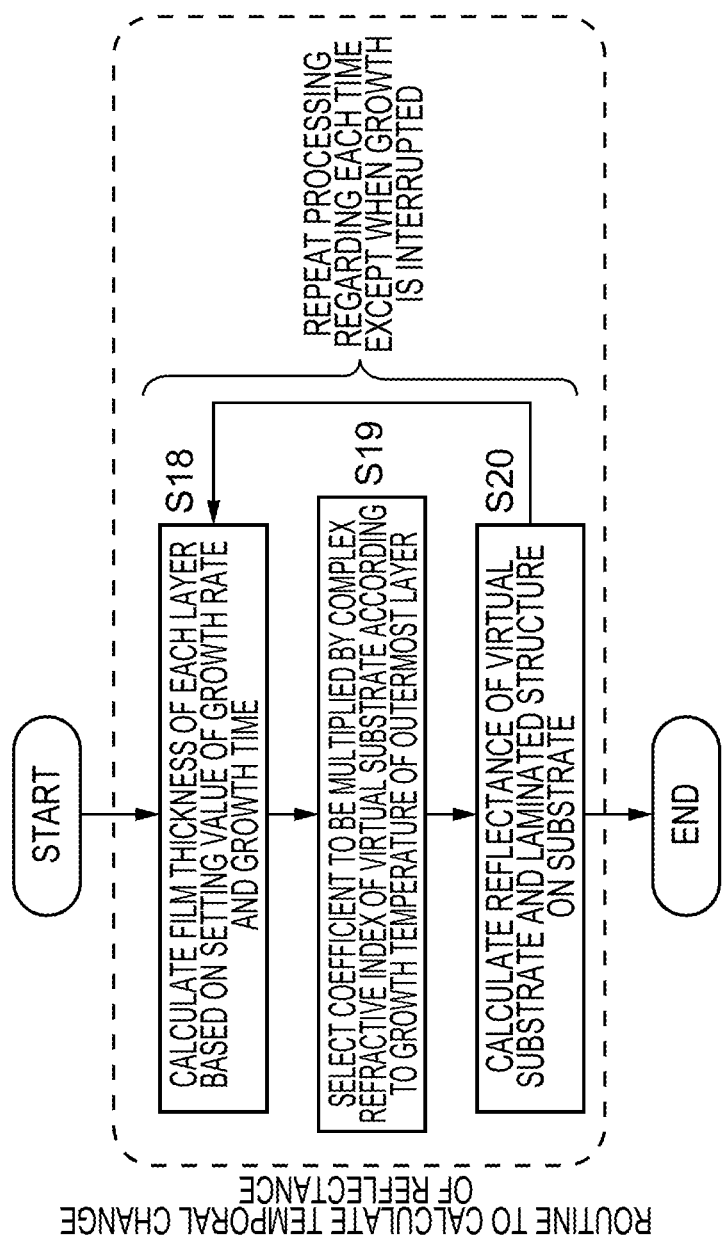
FIG. 17B is a subroutine called out from FIG. 17A.

FIGS. 17A and 17B are flowcharts illustrating a procedure of performing the model calculation of the reflectance based on the second method. Steps S11 to S17 in FIG. 17A are the same as steps S1 to S7 in FIG. 16A. The subroutine in FIG. 17B is common to FIG. 16B except that the processing in step S19 is different from that in step S9. In step S19 of FIG. 17B, a coefficient to be multiplied by the complex refractive index with no temperature dependence of the virtual substrate is selected as one of the fitting parameters depending on the temperature, and the coefficient is changed according to the growth temperature of the outermost thin film on the virtual substrate. By multiplying the complex refractive index of the virtual substrate by the coefficient, it is possible to select the complex refractive index similar to that in step S9 in FIG. 16B. Therefore, in and after step S20 in FIG. 17B, it is preferable to perform processing similar to those in and after step S10 in FIG. 16B. Even when performing steps S12, S13 and S15 in FIG. 17A, the subroutine in FIG. 17B is called out.

Figure 18A:
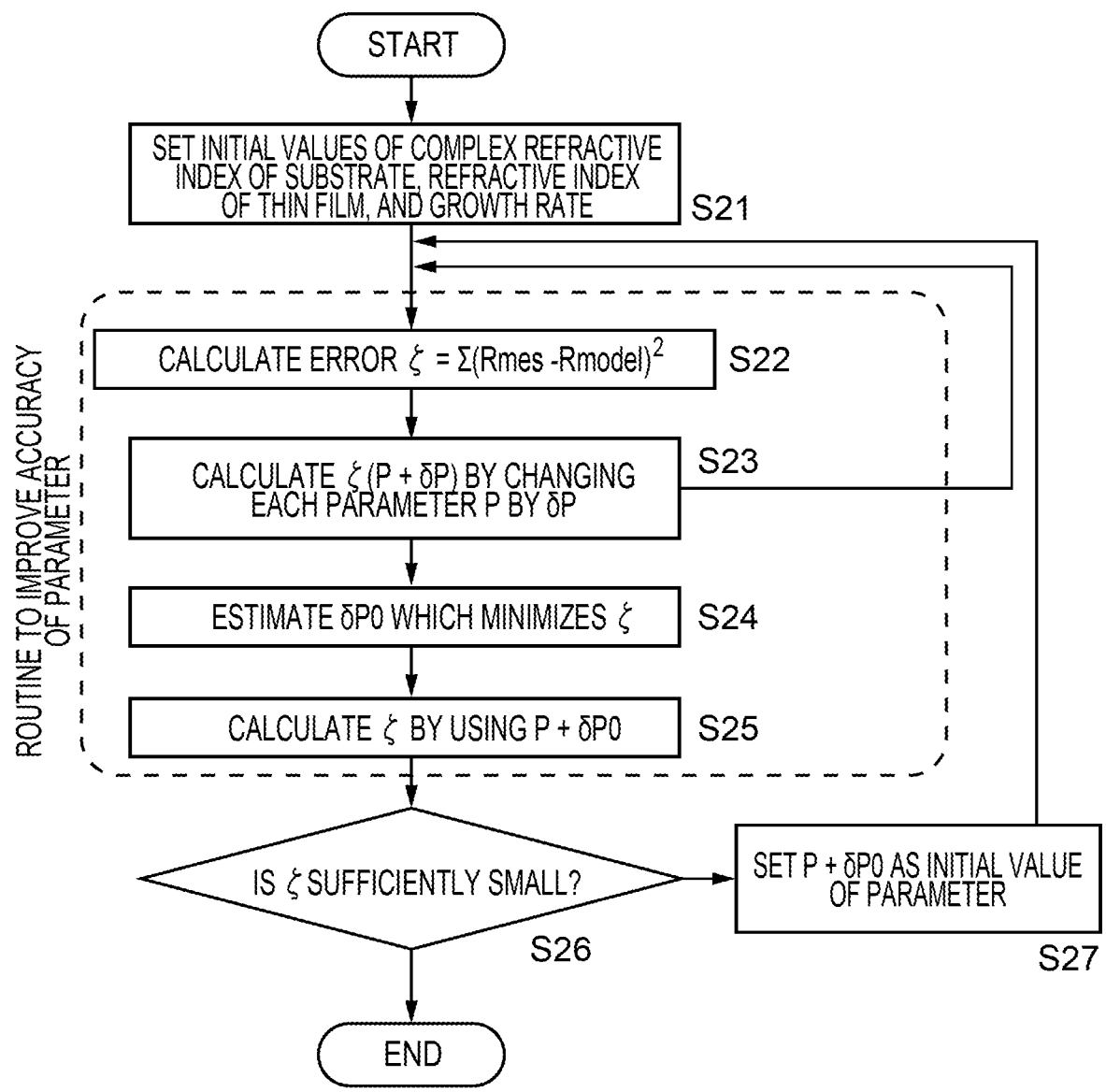
FIG. 18A is a flowchart illustrating a procedure of performing the model calculation of the reflectance based on the third method.
Figure 18B:
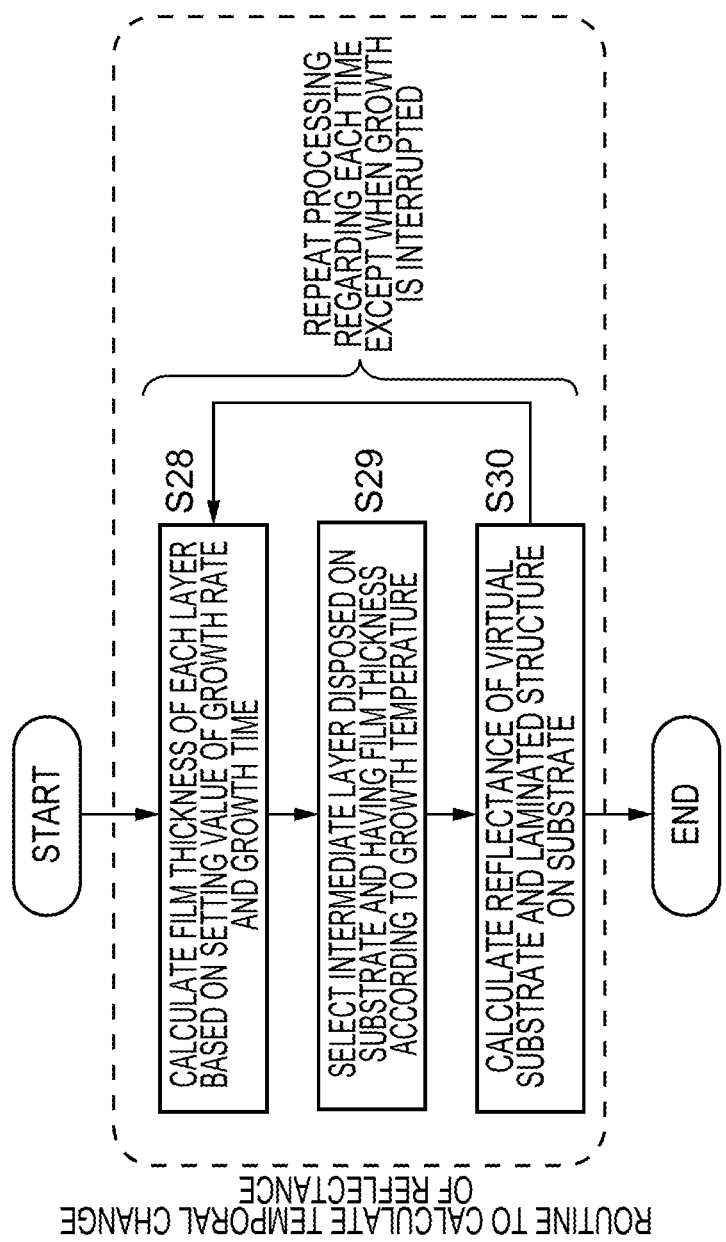
FIG. 18B is a subroutine called out from FIG. 18A.

FIGS. 18A and 18B are flowcharts illustrating a procedure of performing the model calculation of the reflectance based on the third method. Steps S21 to S27 in FIG. 18A are the same as steps S1 to S7 in FIG. 16A. The subroutine in FIG. 18B are common to FIG. 16B except that the processing in step S29 is different from that in step S9 in FIG. 16B. In step S29 in FIG. 18B, the virtual intermediate layer which is disposed between the substrate and the lowermost thin film on the substrate and has the film thickness and/or the refractive index according to the growth temperature is selected as one of the parameters. In step S30, in consideration of the intermediate layer selected in step S29, the reflectance of the virtual substrate and the laminated structure is calculated. Processing in and after step S22 is common to the processing in and after step S2 in FIG. 16A. Even when performing steps S22, S23 and S25 in FIG. 18A, the subroutine in FIG. 18B is called out.

Figure 19:
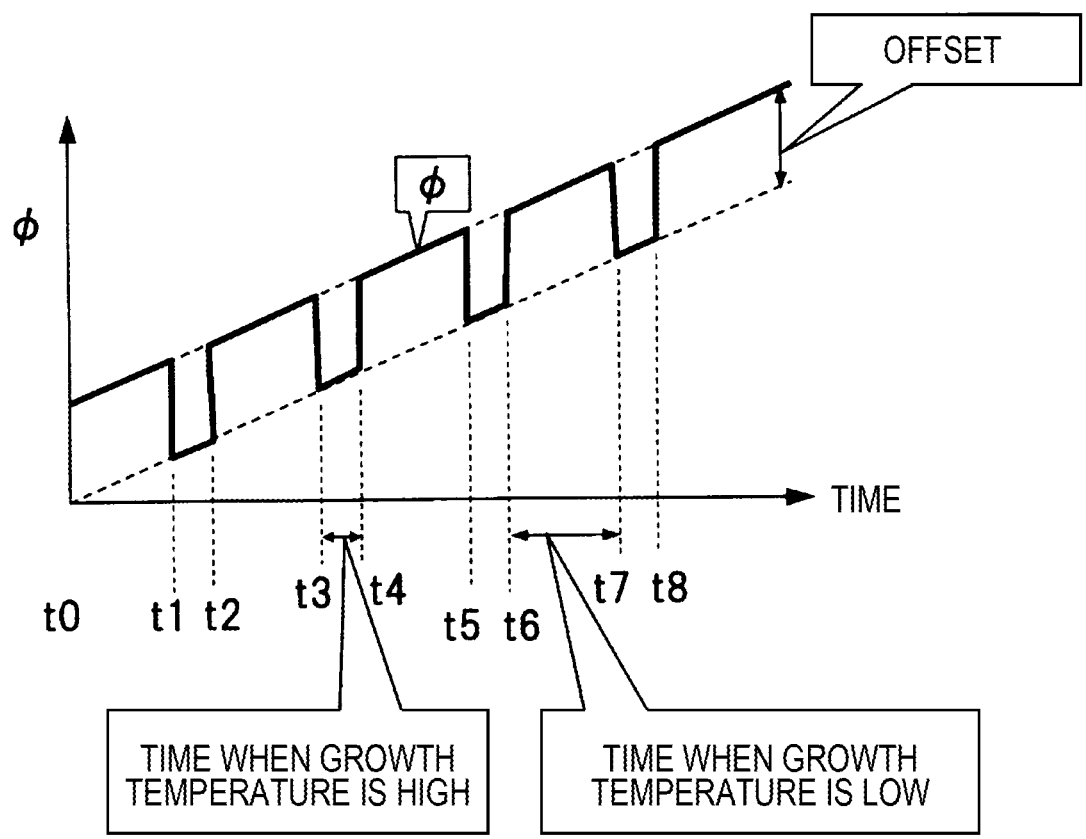
FIG. 19 is a diagram illustrating a relationship between a growth time and a phase φ with a temperature change.

Next, a case of the fourth method will be described. FIG. 19 is a diagram illustrating a relationship between a growth time and a phase φ with a temperature change. Since the phase φ is proportional to the film thickness from the formula (5), if the growth rate is constant, the growth rate changes linearly with time. On the other hand, as illustrated in FIG. 5, the phase changes by a fixed value with respect to the temperature change. That is, if the temperature changes, the phase φ is obtained by adding an offset of a certain value while linearly changing. In FIG. 19, the phase φ increases with time, and displays a negative offset of the phase at a higher temperature. However, this is illustrated for convenience, and the offset may be different depending on cases. In the fourth method, the temperature change of the reflectance is taken by adding an offset Δ depending on the temperature to the change of the phase φ in the outermost layer.

Figure 20A:
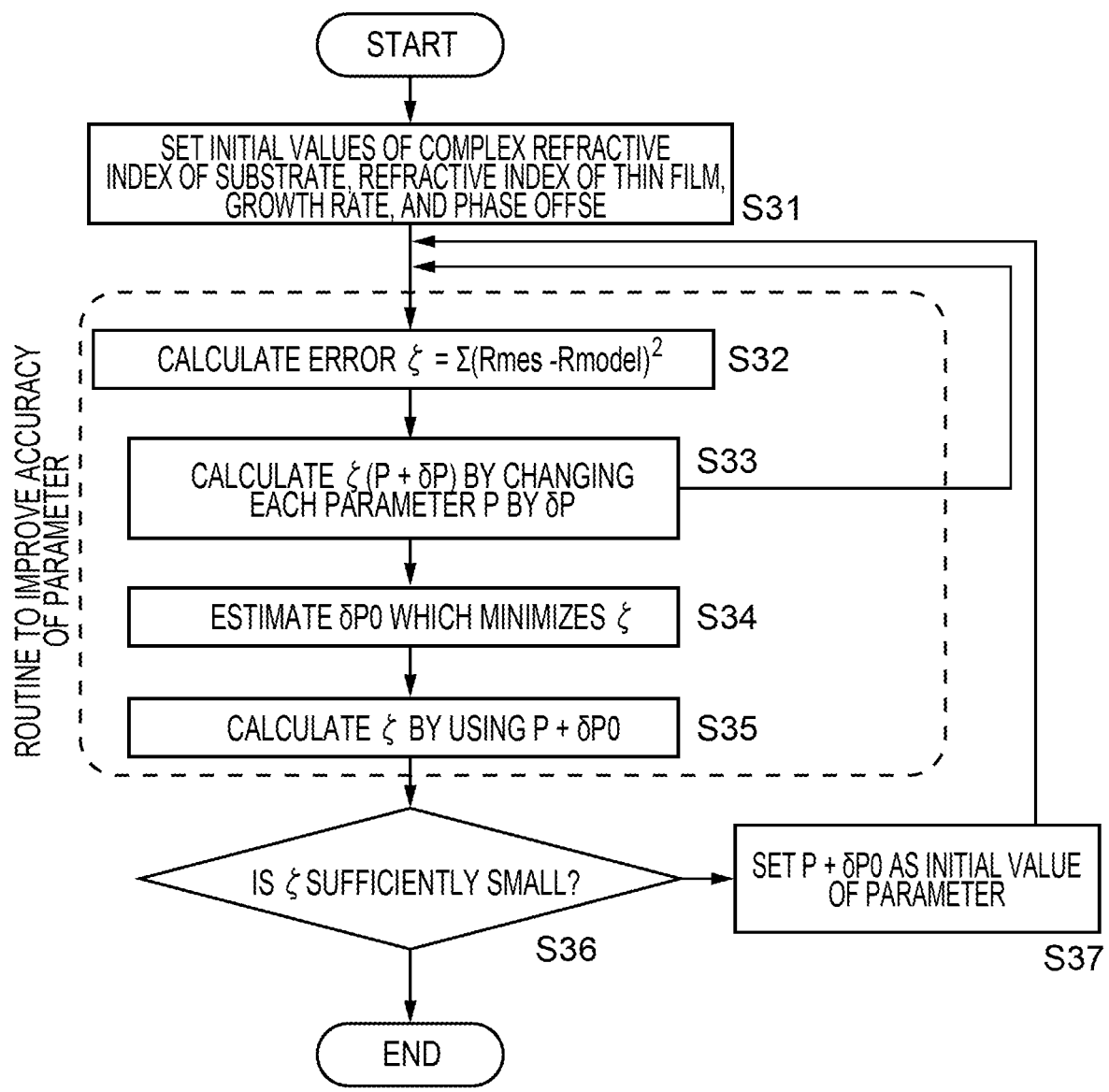
FIG. 20A is a flowchart illustrating a procedure of performing the model calculation of the reflectance based on the fourth method.
Figure 20B:
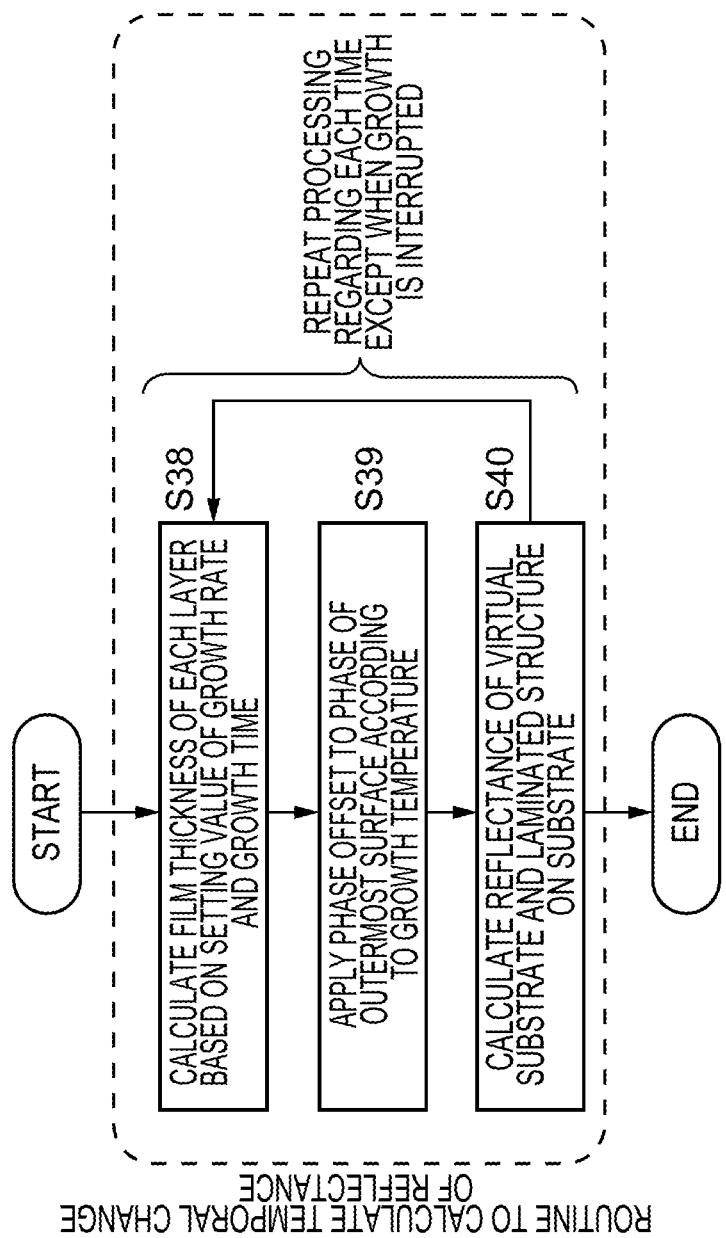
FIG. 20B is a subroutine called out from FIG. 20A.

FIGS. 20A and 20B are flowcharts illustrating a specific procedure of the fourth method. Steps S31 to S37 in FIG. 20A are the same as steps S1 to S7 in FIG. 16A. First, the complex refractive index of the virtual substrate, the refractive indexes and the growth rates as many as the number of kinds of the thin films to be formed, the offsets of the phase as many as the number obtained by subtracting one from the number of film formation temperature conditions are set as the fitting parameters depending on the temperature (step S31, initial parameter setting unit). When performing the step S31, the subroutine in FIG. 20B is called out. The subroutine in FIG. 20B is common to FIG. 16B except that the processing in step S39 is different from step S9 in FIG. 16B. That, at each predetermined time tn, the film thickness of each layer is calculated based on the set value of the growth rate and the growth time (step S38, film thickness calculation unit). Next, at each time tn, the phase offset according to the film formation temperature condition is added to the phase of the outermost layer (step S39, phase offset unit). Next, the reflectance Rmodel of the virtual substrate and the multi-layer films are calculated based on the complex refractive index of the virtual substrate and the film thickness and the refractive index of each layer in the multi-layer films (step S40, reflectance calculation unit). Even when performing steps S32, S33 and S35 in FIG. 20A, the subroutine in FIG. 20B is called out.

In the example in which the MQW layer is grown, two growth temperatures of the barrier layer and the well layer are provided. Therefore, to the phase φ, a value calculated based on the refractive index and the film thickness is added, and in addition, a specific phase offset is added according to the growth temperature of the well layer or the barrier layer. In the virtual interface method, the initial value of the phase φ is expressed by the refractive index and the absorption coefficient of the virtual substrate. Therefore, it is not necessary to add the specific phase offset according to the temperature regarding a growth temperature of a first layer in the multi-layer film. Even in a case where three or more growth temperatures of the multi-layer film are used, the number of phase offsets is a number which is one less than the number of growth temperatures. Specifically, an offset of the phase of the first layer in the multi-layer film is set to zero, and a different phase offset is added for each of different temperatures in subsequent growth. Actually, since the phase offset is also used as the fitting parameter, it is not necessary to previously know its strictly precise value.

Many methods of optimizing the parameter have been known. A preferable method can be used in consideration of a speed and accuracy of calculation.

To verify that the present embodiment can be effectively used, first, the result of the model calculation illustrated in FIG. 6A is analyzed by the first method. As a result, the refractive indexes and the growth rates of the well layer and the barrier layer are respectively 2.98 and 0.106 nm/second and 2.51 and 0.101 nm/second. It is confirmed that the refractive indexes and the growth rates coincide with values used for the model calculation within a range of a calculation error. Next, it is confirmed as follows that the temporal change of the reflectance illustrated in FIG. 3 can be fitted by using the above method.

Figure 21:
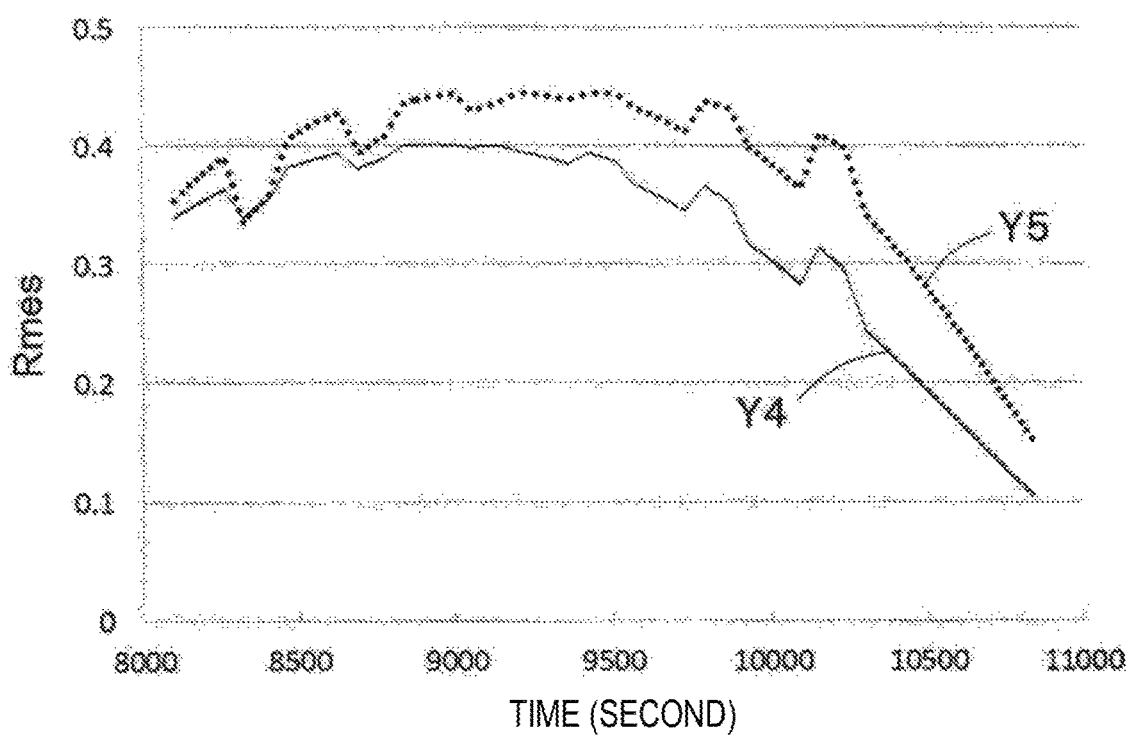
FIG. 21 is a diagram illustrating the temporal change of the reflectance in FIG. 3 and a model calculation result with initial parameters.
Figure 22:
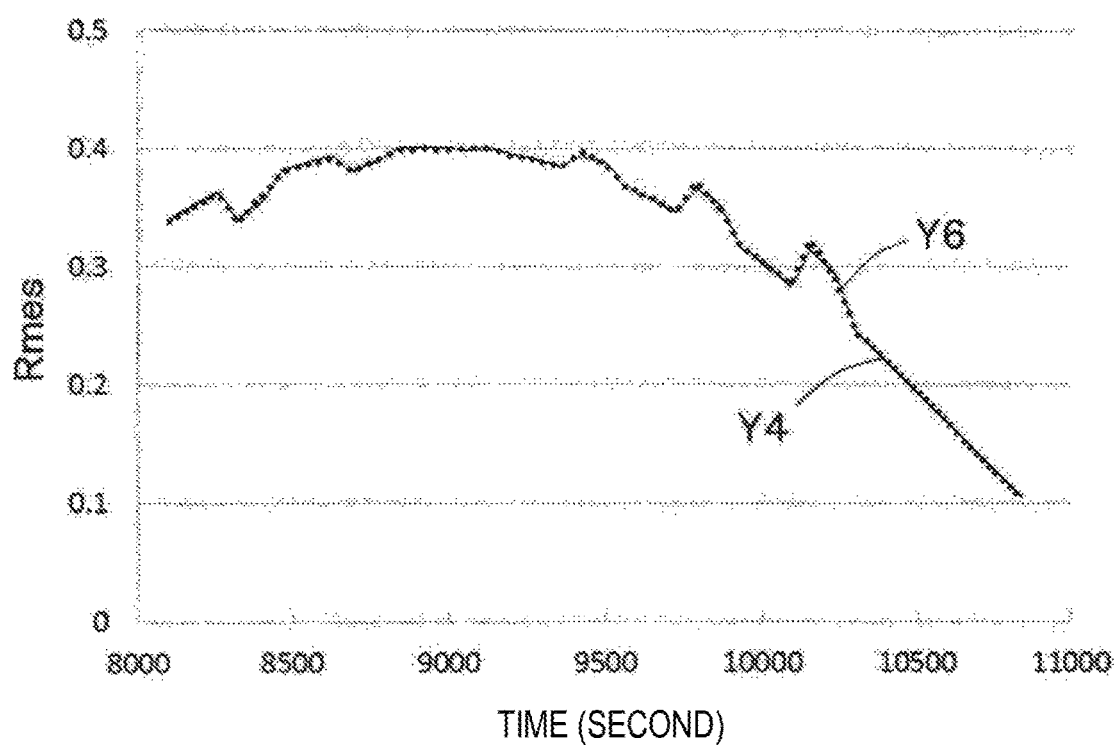
FIG. 22 is a diagram illustrating the temporal change of the reflectance in FIG. 4 and a model calculation result with parameters to which fitting has been performed.

FIG. 21 is a diagram illustrating the temporal change of the reflectance in FIG. 3 and a result of the calculation by using the initial value of the parameter used to calculate the temporal change of the reflectance. A curved line Y4 in FIG. 21 indicates an actual measurement curved line of the reflectance, and a curved line Y5 indicates a temporal change of a reflectance obtained by model calculation. FIG. 22 illustrates the result of optimizing the parameters used for the calculation. The curved line Y4 is a change of actual measurement, and a curved line Y6 is a calculation result by using the optimized parameter. As illustrated in FIG. 22, by adjusting the complex refractive index of the virtual substrate for each growth temperature condition of the thin film, a reflectance function can be faithfully fitted to the actual measurement curved line of the reflectance. Based on the result of the optimization of the parameters showing the curved line Y6 in FIG. 22, the refractive index and the growth rate of the GaN layer can be respectively obtained as 2.46 and 0.036 nm/second, and the refractive index and the growth rate of the InGaN layer can be respectively obtained as 3.15 and 0.039 nm/second.

Similarly, when the temporal change of the reflectance of the curved line Y4 in FIG. 21 is analyzed by using the fourth method, the result coincides with the result of the analysis made by using the first method within the range of the calculation error.

The results in FIGS. 8 and 9 have been calculated by using the measurement result of the reflectance after the growth has been completed. However, similar calculation can be performed based on the temporal change of the reflectance which is measured with time during the growth. In this case, it is possible to calculate the growth rate and the refractive index of the layer which is growing.

As described above, in the present embodiment, when a plurality of kinds of thin films is formed on the substrate in sequence, after the parameter depending on the temperature is adjusted each time when the film formation temperature is changed, the reflectance function is fitted to the actual measurement curved line of the reflectance. Therefore, accuracy of fitting can be improved. Therefore, the growth rate of each thin film can be accurately obtained.

In the embodiment described above, an example has been described in which the two kinds of thin films are alternately formed on the substrate. However, the present embodiment can be similarly applied to a case where three or more kinds of thin films are repeatedly formed on the substrate in sequence.

In the above description, it has been assumed that growth is interrupted while the temperature changes. In a case where the film is grown while the temperature changes, the change of the temperature and the change of the film thickness change the reflectance. Therefore, the influences of the respective changes cannot be separated, and the analysis cannot be performed with the methods described above. However, in a case where the influence of the temperature and the film thickness to the reflectance can be estimated to some extent, analysis may be performed in a case where both the temperature and the film thickness are changed based on the estimation.

One of the methods is a method used in a case where the growth rate can be estimated. Specifically, the case is a case where the growth rate does not depend on the temperature very much when the film is grown while the temperature changes. In this case, the film thickness of the thin film which grows during the temperature change is increased. However, the film thickness is calculated based on the growth time and the estimated growth rate. The film thickness calculated in this way is used to calculate the reflectance. However, since the influence of temperature on reflectance cannot be estimated, the reflectance is not calculated during the temperature change. That is, when the temperature changes, the reflectance is not compared with the actually measured reflectance.

For example, in a case where the temperature is changed while a material is supplied, if it is assumed that a supply amount of the material is half of that after the temperature change is completed, the film thickness of the thin film which grows after the temperature change is completed is obtained by adding a film thickness, obtained by multiplying a half of the set growth rate and a time of the temperature change, to the layer which grows after the temperature change is completed. The parameters are fitted for the times when the temperature is constant.

In another method, the film thickness of the layer which grows during the temperature change is calculated as described above, the parameter depending on the temperature (in the first method, complex refractive index of virtual substrate) is interpolated between two temperatures and the reflectance is calculated during the temperature change. As an interpolation method of the parameter depending on the temperature during the temperature change, a method of proportionally dividing by time, proportionally dividing by the actually measured temperature, and the like can be used.

The reflectance in the present embodiment is a reflectance in a case where the surface of the substrate is an optical mirror and the thin film to be grown is also a mirror surface. However, the thin film to be grown may have some unevenness in some cases. Depending on the degree of the unevenness, the reflectance may change in comparison with that in the case where the thin film is a mirror surface. Generally, if the surface of the thin film to be grown is uneven, the reflectance gradually decreases. If the method according to the present embodiment is used based on the reflectance from such a layer which is not a mirror surface, the error increases. In such a case, the reflectance may be appropriately corrected. Specifically, for example, the maximum value and the minimum value of an amplitude of the reflectance which gradually decreases are corrected to be those of an initial amplitude.

The film formation process has been described above. However, the description can be applied to a film etching process by using a negative growth rate.

As the calculation method of the reflectance of the substrate on which the multi-layer film is formed, the transfer matrix method has been exemplified. However, the reflectance may be calculated by using other methods. Furthermore, several embodiments regarding the usage of the parameter depending on the temperature have been exemplified. However, a method mathematically equivalent to the embodiments may be used.

For example, in the transfer matrix method, regarding each single layer included in the laminated structure of the thin films, a matrix referred to as a transfer matrix defined by the thickness and the refractive index of each layer is calculated. Then, the matrixes of all the layers included in the laminated structure is multiplied by a vector calculated based on the complex refractive index of the substrate to calculate an optical response. On the other hand, as an example of another method of calculating the reflectance, a method of obtaining a reflectance of a single layer as obtained in the formula (4) and a method of calculating the reflectance of each of the single layers included in the multi-layer film in sequence are exemplified. Specifically, when the reflectance of the single layer is calculated, a reflectance of a next layer can be calculated by using the reflectance. By performing such calculation regarding all the layers included in the multi-layer film, a reflectance of the entire multi-layer film can be calculated.

According to these examples, for example, in the first embodiment, even when the change of the complex refractive index of the virtual substrate caused by the temperature is expressed as the changes of the reflectance of the virtual substrate and the layers laminated on the substrate, the calculation can be performed by using the method of calculating the reflectance in sequence. The calculation method of the reflectance is not limited to these, and other methods mathematically equivalent to these methods can be used.

Several embodiments of the present invention have been described. These embodiments have been presented as an example and are not intended to limit the scope of the invention. These novel embodiments can be implemented in various other forms, and various omissions, replacements, and changes can be made without departing from the gist of the invention. These embodiments and modifications thereof are included in the scope and gist of the invention, and are included in the invention described in the claims and the equivalent scope thereof.

The invention claimed is:

1. A vapor phase growth rate measuring apparatus comprising:
   an initial parameter setting adjuster to set initial values of fitting parameters including a complex refractive index of a substrate, a refractive index of each thin film to be formed on the substrate, a growth rate of each thin film, and at least one parameter having temperature dependence;
   a film thickness calculator to calculate a film thickness of each thin film based on a growth time of each thin film and the set growth rate of each thin film;
   a parameter selector to select a value in accordance with a growth temperature for the parameter having the temperature dependence;
   a reflectometer to measure a reflectance of the substrate on which the thin films are formed;
   a reflectance calculator to calculate a reflectance of the substrate on which the thin films are formed by using the values of the fitting parameters;
   an error calculator to calculate an error between the reflectance calculated by the reflectance calculator and an actual measurement value of the reflectance measured by the reflectometer of the corresponding thin film at a plurality of times after film formation of each thin film is started;
   a parameter changer to change at least a part of the values of the fitting parameters in a case where the error is equal to or more than a predetermined value; and
   an output value generator to generate characteristic values of each thin film based on the values of the fitting parameters at the time when the error is less than the predetermined value.

2. The vapor phase growth rate measuring apparatus according to claim 1, wherein the parameter having the temperature dependence includes the complex refractive index of the substrate which changes in accordance with a growth temperature of an outermost thin film on the substrate.

3. The vapor phase growth rate measuring apparatus according to claim 1, wherein the parameter having the temperature dependence includes a coefficient to be multiplied by a complex refractive index of the substrate without having the temperature dependence.

4. The vapor phase growth rate measuring apparatus according to claim 1, wherein the parameter having the temperature dependence includes at least one of a film thickness and a refractive index of a virtual intermediate layer disposed between the substrate and a lowermost thin film on the substrate.

5. The vapor phase growth rate measuring apparatus according to claim 1, wherein the parameter having the temperature dependence includes a phase offset of an outermost thin film on the substrate.

6. The vapor phase growth rate measuring apparatus according to claim 1, wherein processing of the film thickness calculator, the parameter selector, the reflectance calculator, the error calculator, and the parameter changer is repeatedly performed until the error falls to be less than the predetermined value.

7. A vapor phase growth apparatus comprising:
   a reaction chamber to form a thin film on a substrate by a vapor phase growth reaction;
   a gas supply unit to supply a gas to the reaction chamber;
   a heating means to heat the substrate;
   a reflectometer to measure a reflectance of the substrate on which the thin films are formed;
   an initial parameter setting unit to set initial values of fitting parameters including a complex refractive index of the substrate, a refractive index of each thin film to be formed on the substrate, a growth rate of each thin film, and at least one parameter having temperature dependence;
   a film thickness calculator to calculate a film thickness of each thin film based on a growth time of each thin film and the growth rate of each thin film;
   a parameter selector to select a value in accordance with a growth temperature for the parameter having the temperature dependence;
   a reflectance calculator to calculate a reflectance of the substrate on which the thin films are formed by using the value of the fitting parameter;
   an error calculator to calculate an error between the reflectance calculated by the reflectance calculator and an actual measurement value of the reflectance measured by the reflectometer for the substrate on which a corresponding thin film is formed, at a plurality of times after film formation of each thin film is started;
   a parameter changer to change at least a part of the values of the fitting parameters in a case where the error is equal to or more than a predetermined value; and
   a growth rate output unit to output the growth rate of each thin film based on the value of the fitting parameter at the time when the error is less than the predetermined value.

8. The vapor phase growth apparatus according to claim 7, wherein the parameter having the temperature dependence includes the complex refractive index of the substrate which changes in accordance with a growth temperature of an outermost thin film on the substrate.

9. The vapor phase growth apparatus according to claim 7, wherein the parameter having the temperature dependence includes a coefficient to be multiplied by a complex refractive index of the substrate without having the temperature dependence.

10. The vapor phase growth apparatus according to claim 7, wherein the parameter having the temperature dependence includes at least one of a film thickness and a refractive index of a virtual intermediate layer disposed between the substrate and a lowermost thin film on the substrate.

11. The vapor phase growth apparatus according to claim 7, wherein the parameter having the temperature dependence includes a phase offset of an outermost thin film on the substrate.

12. The vapor phase growth apparatus according to claim 7, wherein processing of the film thickness calculator, the parameter selector, the reflectance calculator, the error calculator, and the parameter changer is repeatedly performed until the error falls to be less than the predetermined value.

13. A vapor phase growth rate measuring method comprising:
setting initial values of fitting parameters including a complex refractive index of a substrate, a refractive index of each thin film to be formed on the substrate, a growth rate of each thin film, and at least one parameter having temperature dependence;
measuring a growth time and calculating a film thickness of each thin film based on the growth time and a setting value of the growth rate of each thin film;
selecting a value in accordance with a growth temperature for the parameter having the temperature dependence;
calculating a reflectance of the substrate, on which each thin film is formed, by using the value of the fitting parameter;
calculating an error between the calculated reflectance and an actual measurement value of the reflectance of a corresponding thin film at a plurality of times after film formation of each thin film is started;
changing at least a part of the values of the fitting parameters in a case where the error is equal to or more than a predetermined value, calculating the reflectance of the substrate on which the thin films are formed again, and calculating an error with the actual measurement value; and
generating characteristic values of each thin film based on the fitting parameters at the time when the error falls to be less than the predetermined value.

14. The vapor phase growth rate measuring method according to claim 13, wherein at least a part of the parameters having the temperature dependence is repeatedly changed until the error falls to be less than the predetermined value.

15. The vapor phase growth rate measuring method according to claim 13, wherein the parameter having the temperature dependence includes the complex refractive index of the substrate which changes in accordance with a growth temperature of an outermost thin film on the substrate.

16. The vapor phase growth rate measuring method according to claim 13, wherein the parameter having the temperature dependence includes a coefficient to be multiplied by a complex refractive index of the substrate without having the temperature dependence.

17. The vapor phase growth rate measuring method according to claim 13, wherein the parameter having the temperature dependence includes at least one of a film thickness and a refractive index of a virtual intermediate layer disposed between the substrate and a lowermost thin film on the substrate.

18. The vapor phase growth rate measuring method according to claim 13, wherein the parameter having the temperature dependence includes a phase offset of an outermost thin film on the substrate.

19. The vapor phase growth rate measuring method according to claim 13, wherein the calculating the film thickness, the selecting the value, the calculating the reflectance, the calculating the error, and the changing at least a part of the values of the fitting parameters are repeatedly performed until the error falls to be less than the predetermined value.

20. The vapor phase growth rate measuring method according to claim 13, wherein the reflectance of the substrate on which the thin film is formed is obtained by sequentially calculating the reflectance of the thin film to be laminated next by using a transfer matrix method or the reflectance of the thin film.

* * * * *